(12) United States Patent
Yuasa et al.

(10) Patent No.: US 7,576,420 B2
(45) Date of Patent: Aug. 18, 2009

(54) SEMICONDUCTOR INTEGRATED CIRCUIT DEVICE HAVING REDUCED TERMINALS AND I/O AREA

(75) Inventors: Yuichi Yuasa, Hokkaido (JP); Noriyoshi Watanabe, Hokkaido (JP)

(73) Assignee: Mitsumi Electric Co., Ltd., Tama-shi (JP)

( * ) Notice: Subject to any disclaimer, the term of this patent is extended or adjusted under 35 U.S.C. 154(b) by 4 days.

(21) Appl. No.: 11/881,224

(22) Filed: Jul. 26, 2007

(65) Prior Publication Data

US 2008/0088000 A1   Apr. 17, 2008

(30) Foreign Application Priority Data

Jul. 31, 2006   (JP)   ............................. 2006-207826

(51) Int. Cl.
*H01L 25/065* (2006.01)
(52) U.S. Cl. .................. 257/685; 257/678; 257/691; 257/735; 257/E25.011; 257/E25.012
(58) Field of Classification Search ................. 257/678, 257/691, 685, 735, E25.011, E25.012
See application file for complete search history.

(56) References Cited

U.S. PATENT DOCUMENTS

| 4,525,809 | A | * | 6/1985 | Chiba et al. ................... 365/51 |
| 5,805,865 | A | | 9/1998 | Mimura et al. |
| 6,580,164 | B1 | | 6/2003 | Ohie |
| 7,199,469 | B2 | | 4/2007 | Ishida et al. |
| 7,341,198 | B2 | * | 3/2008 | Nishizawa et al. .......... 235/492 |
| 2002/0027281 | A1 | | 3/2002 | Goto |
| 2004/0262775 | A1 | * | 12/2004 | Ohie ........................... 257/777 |
| 2005/0146018 | A1 | * | 7/2005 | Jang et al. .................... 257/698 |
| 2008/0049483 | A1 | | 2/2008 | Horiuchi |
| 2008/0050862 | A1 | | 2/2008 | Yano et al. |

FOREIGN PATENT DOCUMENTS

| JP | 2001-267488 A | | 9/2001 | |
| WO | WO2005/081181 | * | 1/2005 | ...................... 19/6 |

OTHER PUBLICATIONS

Related U.S. Appl. No. 11/881,223, filed Jul. 26, 2007; Inventors: Koji Yano and Tomoki Segawa, Title: Method of Manufacturing a Single Chip Semiconductor Integrated Circuit Device Including a Mask ROM in a Short Time.
Related U.S. Appl. No. 11/881,227, filed Jul. 26, 2007; Inventor: Michihiro Horiuchi, Title: Semiconductor Integrated Circuit Device Including Semiconductor Integrated Circuit Board Supplied With No High Voltage.

* cited by examiner

*Primary Examiner*—Victor A Mandala
(74) *Attorney, Agent, or Firm*—Frishauf, Holtz, Goodman & Chick, P.C.

(57) ABSTRACT

In a semiconductor integrated circuit device including a semiconductor integrated circuit board having a mask ROM area and an internal bus and a programmable ROM which is mounted on the semiconductor integrated circuit board and which has a plurality of ROM connecting terminals, the ROM connecting terminals are electrically connected to a plurality of bus connecting terminals connected to the internal bus, respectively. The bus connecting terminals may be disposed around periphery of the semiconductor integrated circuit board, may be formed on the mask ROM area, and may be disposed on the internal bus. In this event, the ROM connecting terminals and the bus connecting terminals are electrically connected to each other using wire bonding technique.

7 Claims, 21 Drawing Sheets

SEMICONDUCTOR INTEGRATED CIRCUIT DEVICE HAVING REDUCED TERMINALS AND I/O AREA

This application is based upon and claims the benefit of priority from Japanese patent application No. 2006-207826, filed on Jul. 31, 2006, the disclosure of which is incorporated herein its entirety by reference.

BACKGROUND OF THE INVENTION

This invention relates to a semiconductor integrated circuit device.

As well know in the art, a microcomputer is defined by a miniaturized electronic computer constituted by a microprocessor. The microprocessor is a processor wherein a central processing unit (CPU) of the computer is integrated on one or few large-scale integrated circuits (LSIs). The microcomputer normally comprises the CPU, an input/output device, and a main memory device. The main memory device comprises a random access memory (RAM) and a read only memory (ROM). An input/output control LSI is used as a connecting circuit portion for the input/output device. A single chip microcomputer is a microcomputer where the CPU, the RAM, the ROM, and the input/output LSI are mounted in a one chip. The single chip microcomputer is called a one chip microcomputer.

A program is read from an outside of a chip of the microprocessor while the program is preliminarily installed in the inside in the chip of the signal chip microcomputer. The microprocessor is capable of changing processing contents by renewing the program of the outside while it is almost impossible for the single chip microcomputer to change processing contents by a user because the program is already installed in the inside in the chip thereof. Herein, the program is preliminarily stored in the ROM.

In addition, as well know in the art, read only memories (ROMs) are broadly divided into mask ROMs wherein wiring of contents is carried out at a manufacturing process in a semiconductor maker and programmable ROMs (PROMs) where a user can electrically write with the program therein.

The mask ROMs can be manufactured at the lowest price among the semiconductor memories in principle. Therefore, products having a large memory capacity are manufactured as the mask ROMs. On the other hand, the programmable ROMs have features wherein the writing of the program can carry out by a user at hand. The programmable ROMs are classified into PROM in a narrow sense wherein the user can program only once, erasable and programmable ROMs (EPROMs) which can be electrically programmed and can be erased by ultraviolet light or the like, and electrically erasable programmable ROMs (EEPROMs).

In the EPROM, the user can program and all of data can be erased by irradiating it with ultraviolet light to be enable to rewrite therein. Inasmuch as a glass window for erasing by ultraviolet light is required in the EPROM, the EPROM is commonly contained in a ceramic package. There is a one time programmable ROM (OTP) as the EPROM in a narrow sense. The OPT comprises a semiconductor chip embedded therein that is similar to that of the EPROM but the OTP cannot be erased by ultraviolet light because the OTP comprises a package with no window. By using an ordinary EPROM programmer, the user can program information to each memory cell in the OTP only once. The OTP has a cost which is higher than that of the mast ROM and which is lower than that of the EPROM. There is a flash EEPROM as a kind of the EEROMs. The flash EEPROM is also called a flash memory which can electrically erase all of bit contents (which may erase every block) to rewrite contents therein among the programmable read only memories (PROMs).

Such a single chip microcomputer is mounted in an ordinary electric calculator, a printer, a keyboard, a microprocessor-controlled automatic (electric) rice cooker, a microprocessor-controlled camera, an engine controller for an automobile, an so on. Inasmuch as the single chip microcomputer mainly often controls operations of its equipment with it installed in the equipment, the single chip microcomputer may be called a microcontroller. In addition, the microcontroller is a kind of the single chip semiconductor integrated circuit devices.

In order to effectively carry out development of the equipment (an electronic device) in which such a single chip microcomputer (microcontroller) is installed, various development systems (development tools) are delivered by semiconductor makers or development tool makers. Inasmuch as the single chip microcomputer (microcontroller) comprises hardware and software which are closely related to each other and has a short time period of development, debug of the software and checking of the hardware must be simultaneously carried out. That is, development of the hardware and the software must often carried out concurrently. In this event, the debug of the software is required with a yet-to-be-completed hardware.

There is an emulator as one of debug tools (development tools). Herein, the emulator is a device or a computer program for imitating, by using a system, another system. With the help of the emulator, verification of functional operations of the equipment (electronic device) installed with the software is carried out. Emulators are divided into an in-circuit emulator (ICE) which is used with it directly connected to the equipment (the electronic device) under development and a software emulator using a logic simulator. That is, the in-circuit emulator is a development tool for supporting the verification of the functional operations of the equipment (electronic device) by directly connecting it to the equipment (electronic device) mounting a program-controlled microcontroller under development.

Usually, development of the hardware of the microcontroller is carried out by the semiconductor maker side while development of the software of the microcontroller is carried out by the user side. That is, development of the microcontroller is carried out by cooperative working of the semiconductor maker and the user.

Now, the description will proceed to a conventional method of manufacturing of a microcontroller. Herein, the description will be directed to the method of manufacturing, as an ultimate product, a microcontroller comprising a mask ROM in which an ultimate program is stored.

First of all, between the semiconductor maker and the user, investigation of specifications of the microcontroller (the single chip semiconductor integrated circuit device) to be manufactured is carried out. Herein, the ultimate microcontroller to be manufactured comprises a CPU, an RAM, a mask ROM, and an input/output control LSI which are incorporated into a one chip. In addition, the CPU, the RAM, the mask ROM, and the input/output control LSI are mutually connected to each other via an internal bus. The internal bus comprises an address bus and a data bus.

The semiconductor maker provides the user with the emulator (the software emulator and the in-circuit emulator) as the envelopment tool while the user develops, by using the emulator, software (a program) to be stored in the above-mentioned mask ROM.

Subsequently, the semiconductor maker designs a product in OTP version and the user carries out debug of the program using the software emulator. Herein, the product in OTP version (a provisional microcontroller) to be designed comprises a CPU, an RAM, the OTP, and an input/output control LSI which are incorporated into a one chip. In other words, the provisional microcontroller is similar in structure to the ultimate microcontroller except that the OTP is used in lieu of the mask ROM. However, any program is not stored in the OTP and storing of the program to the OTP is carried out by the user side in the manner which will later be described. The provisional microcontroller is sealed in a semiconductor package. On the other hand, carried out by the user, debug of the program using the software emulator is carried out with the hardware put into a yet-to-be-completed state.

The semiconductor maker provides the user with a plurality of the provisional microcontrollers which are similar in structure to one another. The user stores, by using the EPROM programmer (writer), a provisional program (which is a program debugged by using the software emulator) in the OTP in one selected from the plurality of the provisional microcontrollers, mounts the selected provisional microcontroller in question in an equipment (a target board), and carries out a test of the provisional program. That is, by using the above-mentioned in-circuit emulator, the user carries out verification of functional operations of the equipment (target board). In the manner which is described above, the OTP is a PROM in which information can be written only once. Accordingly, if any correction place (error) is found out in the provisional program by the test, the user stores a corrected provisional program in another provisional microcontroller, and carries out retest and re-correction of the corrected provisional program. That is, the test and the correction (the retest and the re-correction) of the provisional program is repeatedly carried out. By repeating operations of the test and the correction (the retest and the re-correction) for the provisional program, an ultimate program is determined by the user side.

On the other hand, after the provisional controllers are provided to the user, the semiconductor maker subsequently carries out design of a produce in mask ROM version. Herein, the product in mask ROM version (an actual microcontroller to be mounted in the equipment) to be designed comprises a CPU, an ROM, the mask ROM, and an input/output control LSI which are incorporated in a one chip. However, at this time instance, the ultimate program has yet to be written in the mask ROM of the actual microcontroller.

The user sends (provides) the above-mentioned determined ultimate program to the semiconductor maker. The semiconductor maker stores, using ion implantation, the ultimate program in the mask ROM of the actual microcontroller, thereby a microcontroller as the ultimate product is manufactured. In addition, the microcontroller manufactured in the manner which is described above is sealed in a semiconductor package and is produced in large quantity. And, ultimate microcontrollers produced in large quantity are provided to the user.

The user mounts the ultimate microcontrollers in the respective equipments (electronic devices), thereby the equipments are produced in large quantity.

Although the above-mentioned microcontroller comprises one semiconductor chip, U.S. Pat. No. 7,199,469 or U.S. Pat. No. 7,199,469 B2 issued to Ishida et al. discloses a semiconductor device (a microcontroller) having stacked two semiconductor chips sealed with a resin seal member. As the semiconductor device, a semiconductor device called a multi chip package (MCP) type is known. Although ones having various structures are developed and manufactured in the MCP type semiconductor devices, the MCP type semiconductor device comprising the stacked two semiconductor devices sealed with the resin seal member becomes most widespread. Ishida et al. discloses the semiconductor device wherein a chip for a microcomputer (a first semiconductor chip) and a chip for EEPROM (a second semiconductor chip) are incorporated in a package. That is, Ishida et al. discloses the semiconductor device wherein the chip for EEPROM (the second semiconductor chip) is stacked on the chip for the microcomputer (the first semiconductor chip) and the two chips are sealed with the resin seal member. The chip for the microcomputer comprises a processor unit (CPU), an ROM unit, an RAM unit, a timer unit, an A/D conversion unit, a serial communication interface unit, a data input/output circuit unit, and so on which are mounted on the same board. Those units are mutually connected through a data bus and an address bus. The processor unit mainly comprises a central processing portion, a control circuit portion, an arithmetic circuit portion, and so on. The chip for the microcomputer having such a structure is operated by a program. On the other hand, the chip for the EEPROM comprises a serial communication interface unit, a nonvolatile storage unit, and so on which are mounted on the same board. According to Ishida et al., electrical connection between the first semiconductor chip and the second semiconductor chip is carried out by internal leads among leads disposed around the first semiconductor chip and two bonding wires.

In addition, United States Patent Application Publication No. 2002/0027281 A1 or US 2002/0027281 A1 discloses a multi chip package (a semiconductor device) which is capable of controlling a rise in temperature, which occurs inside a package due to heat (self-heating) radiated from a semiconductor chip. According to US 2002/0027281 A1, the multi chip package constructing a microcontroller comprises a lower semiconductor chip on which the microcontroller including a mask ROM is formed and an upper semiconductor chip including flash memory mounted on the lower semiconductor chip. Inasmuch as no transistor is formed on the lower semiconductor chip under the upper semiconductor chip, it is possible to neglect the self-heating in this area. In addition, US 2002/0027281 A1 discloses an embodiment wherein transistors having a mask ROM function are formed on the lower semiconductor chip at a mounting area (a substantially central area) for the upper semiconductor chip and the upper semiconductor chip (the flash memory) is mounted on the mounting area. In this event, the mask ROM function in the lower semiconductor chip is discarded.

In the above-mentioned conventional method of manufacturing the microcontroller, the semiconductor maker must carry out design of two kinds of products, namely, design of a product of the OTP version and design of a product of the mask ROM version. As a result, the conventional method is disadvantageous in that it takes very much time (e.g. one year or one and half years) to develop the microcontroller as the ultimate product.

In addition, the product of the OTP version and the product of the mask ROM version are a pin-for-pin equivalent in a package state and can be substituted by each other. However, the product of the OTP version and the product of the mask ROM version are different from each other as semiconductor chips and cannot be compatible in characteristics in abundance. That is, when the product of the mask ROM version is replaced with the product of the OTP which is completed with evaluation, there are cases where a malfunction such as no operation occurs.

On the other hand, as disclosed in the above-mentioned U.S. Pat. No. 7,199,469 B2 and the above-mentioned US 2002/0027281 A1, it can be considered that a method of manufacturing, as the ultimate product, the microcontroller having the stacked two semiconductor chips sealed with the resin seal member without using one semiconductor chip. However, inasmuch as the EEPROM (the flush memory) is very expensive compared to the mask ROM, it is unsuited for a case of high volume production of the microcontrollers.

In addition, US 2002/0027281 A1 discloses the embodiment where the upper semiconductor chip (the flash memory) is mounted on the mask ROM area of the lower semiconductor chip and the mask ROM function is discarded. However, US 2002/0027281 A2 neither discloses nor teaches concrete means (structure) how to discard the mask ROM function.

Furthermore, in the multi chip package (MCP) as disclosed in U.S. Pat. No. 7,199,469 B2 or US 2002/0027281 A1, a sub chip (the upper chip, the EEPROM chip) is stacked on a base chip (the chip for the microcomputer). In such a multi chip package, there is a problem how to electrically connect ROM connecting terminals of the sub chip.

In US 2002/0027281 A1, the ROM connecting terminals are electrically connected, using wire bonding technique, to outer leading terminals of a lead frame (a wiring board) on which the base chip is mounted. However, this structure is disadvantageous in that it is necessary to prepare a lot of terminals of a package (resin seal member) for sealing the base chip and the sub chip.

On the other hand, in U.S. Pat. No. 7,199,469 B2, the ROM connecting terminals are electrically connected, using wire bonding technique, to an input/output (I/O) area formed on the base chip. However, this structure is disadvantageous in that the I/O area in the base chip increases.

SUMMARY OF THE INVENTION

It is therefore an exemplary object of the present invention to provide a semiconductor integrated circuit device which is capable of stacking a sub chip (a programmable ROM) on a base chip (a semiconductor integrated circuit board) without increasing the number of terminals (outer leading wires) of a package.

It is therefore another exemplary object of the present invention to provide a semiconductor integrated circuit device which is capable of stacking a sub chip (a programmable ROM) on a base chip (a semiconductor integrated circuit board) without increasing an input/output area in the base chip (the semiconductor integrated circuit board).

Other objects of this invention will become clear as the description proceeds.

On describing the gist of this invention, it is possible to be understood that a semiconductor integrated circuit device comprises a wiring board having a plurality of outer leading wires, a semiconductor integrated circuit board which is mounted on the wiring board, which comprises a mask read only memory (ROM) area and an internal bus, and which has a plurality of board connecting terminals electrically connected to the plurality of outer leading wires, and a programmable ROM mounted on said semiconductor integrated circuit board, said programmable ROM having a plurality of ROM connecting terminals. According to an aspect of this invention, the afore-mentioned semiconductor integrated circuit device further comprises a plurality of bus connecting terminals connected to the internal bus. The plurality of bus connecting terminals are electrically connected to the plurality of ROM connecting terminals, respectively.

In the afore-mentioned semiconductor integrated circuit device, the plurality of bus connecting terminals may be disposed around periphery of the semiconductor integrated circuit board, may be formed on the mask ROM area, or may be disposed on said internal bus. In this event, the plurality of ROM connecting terminals are electrically connected to the plurality of bus connecting terminals using wire bonding technique.

In addition, in the afore-mentioned semiconductor integrated circuit device, the plurality of bus connecting terminals may be disposed on the semiconductor integrated circuit board in mirror reversal placement of placement of the plurality of ROM connecting terminals. In this event, the plurality of ROM connecting terminals are electrically connected to the plurality of bus connecting terminals using facedown bonding technique.

DESCRIPTION OF THE PREFERRED EMBODIMENTS

Referring to FIGS. 1 through 7, the description will proceed to a method of manufacturing a microcontroller according to an exemplary embodiment of this invention. Herein, in the manner which is described above, development of hardware of the microcontroller is carried out by a semiconductor maker side while development of software (a program) of the microcontroller is carried out by a user side. That is, development of the microcontroller is carried out in collaboration with the semiconductor maker and the user. In addition, the microcontroller to be manufactured as an ultimate product is one where an ultimate program is stored in a mask read only memory (ROM) and is a kind of single chip semiconductor integrated circuit devices.

First, between the semiconductor maker and the user, the discussions of specification of the microcontroller (the single chip semiconductor integrated circuit device) to be manufactured are carried out. Herein, an ultimate microcontroller to be manufactured comprises a central processing unit (CPU), a random access memory (RAM), a mask read only memory (ROM), and an input/output control large scale integrated circuit (LSI) which are incorporated in one chip. In addition, the CPU, the RAM, the mask ROM, and the input/output control LSI are mutually connected to each other via an internal bus. The internal bus comprises an address bus and a data bus.

The semiconductor maker provides the user with an emulator (which comprises a software emulator and an in-circuit emulator) and the user develops, by using the emulator, software (a program) to be stored in the above-mentioned mast ROM.

The processes described above are similar to those of the above-mentioned conventional method of manufacturing a microcontroller.

Figure 1:
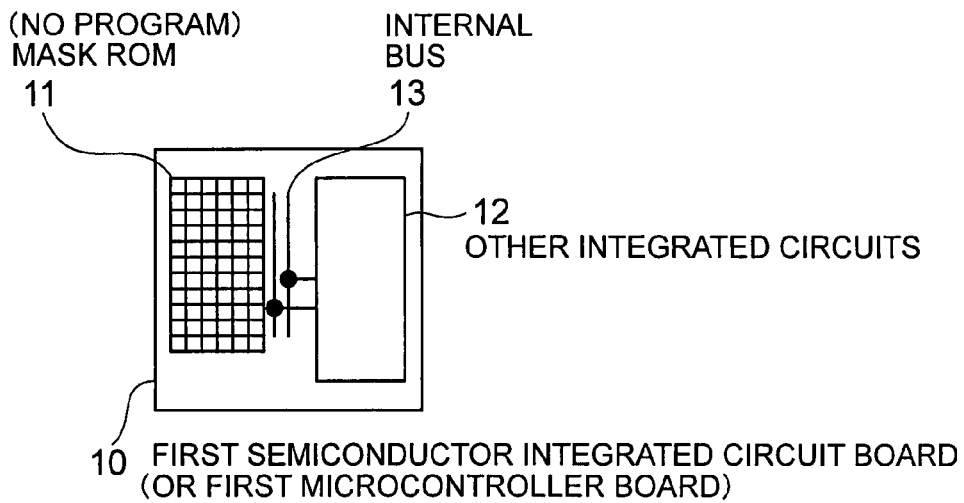
FIG. 1 is a schematic plan view showing a first semiconductor integrated circuit board (a first microcontroller board)

The semiconductor maker carries out design of a product of a mask ROM version as shown in FIG. 1 while the user carries out debug of the program by using the software emulator.

As described above, in the conventional method of manufacturing the microcontroller, the semiconductor maker carries out design of a product of an OTP version. In the method of manufacturing the microcontroller according to the exemplary embodiment of this invention, the semiconductor maker directly carries out the design of the mask ROM version. Herein, the product (a provisional semiconductor integrated circuit board, a provisional microcontroller board) 10 of the mask ROM version to be designed comprises a provisional mask ROM 11 and other integrated circuits 12 which are incorporated in a one chip. The other integrated circuits 12 comprise a CPU, an RAM, and an input/output control LSI. However, any program is not stored in the provisional mask ROM 11. In addition, inasmuch as an OTP, which comprises one of programmable ROMs, is staked on the provisional mask ROM 11 in the manner which will later be described, the provisional semiconductor integrated circuit board (the provisional microcontroller board) 10 is slightly different in structure from an actual semiconductor integrated circuit board (which will later be described) to be ultimately manufactured. In other words, with consideration given to stack the OTP on the mask ROM, the design of the product of the mask ROM is carried out. The provisional semiconductor integrated circuit board (the provisional microcontroller board) 10 is also called a first semiconductor integrated circuit board (a first microcontroller board) while the provisional mask ROM 11 is called a first mask ROM. In addition, the first semiconductor integrated circuit board 10 is also merely called a first semiconductor chip.

At any rate, in this process, the semiconductor maker prepares the first semiconductor integrated circuit board (the first microcontroller board) 10 comprising the first mask ROM 11 in which a program is not stored and a first internal bus 13 where the first mask ROM 11 is scheduled to connected through metal wires.

Figure 2:
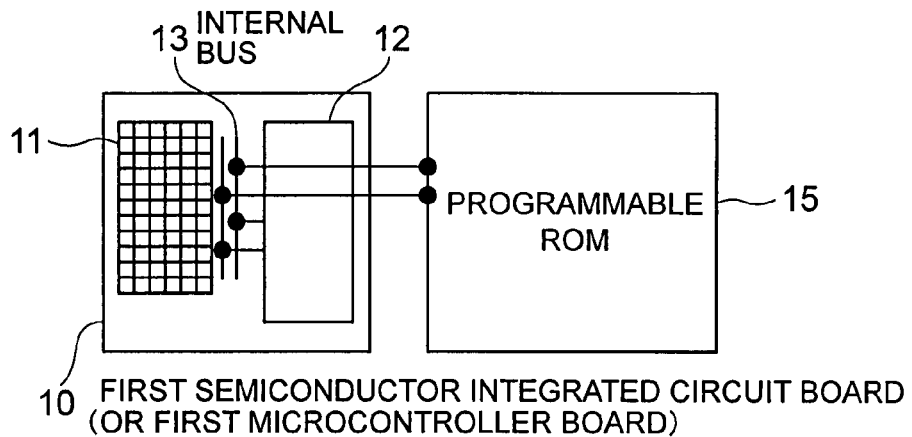
FIG. 2 is a schematic plan view showing a state where a programmable ROM is connected to the first semiconductor integrated circuit board (the first microcontroller board) illustrated in FIG. 1.

Subsequently, as shown in FIG. 2, the semiconductor maker electrically connects a programmable ROM 15 independent from the first semiconductor integrated circuit board (the first microcontroller board) 10 with the first internal bus 13 with the first mask ROM 11 electrically separated from the first internal bus 13. The programmable ROM 15 is a kind of nonvolatile memory devices. In the example being illustrated, an OTP is used as the programmable ROM 15 and the programmable ROM (OTP) 15 is stacked on the mask ROM 11 (see FIG. 3). In the example being illustrated, in this connecting process, the programmable ROM (OTP) 15 is electrically connected to bonding pads (which will later be described) led from the first internal bus 13 using wire bonding technique.

Although electrical connection using the wire bonding technique is implemented by various methods, those methods will later be described more detailed with reference drawings.

Figure 3:
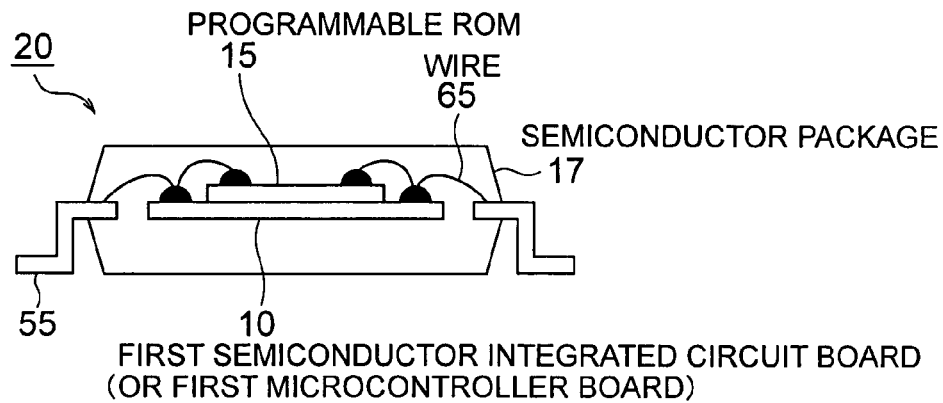
FIG. 3 is a schematic cross sectional view showing a first semiconductor integrated circuit device (a first microcontroller) sealed with a semiconductor package with the programmable ROM stacked on the first semiconductor integrated circuit board (the first microcontroller board)

Subsequently, as shown in FIG. 3, the semiconductor maker seals the first semiconductor integrated circuit board (the first microcontroller board) 10 and the programmable ROM (OTP) 15 in a semiconductor package 17. That is, this sealing process seals the first semiconductor integrated circuit board (the first microcontroller board) 10 and the programmable ROM (OTP) 15 in the semiconductor package 17 with the programmable ROM (OPT) 15 stacked on the first semiconductor integrated circuit board (the first microcontroller board) 10. Thereby, a provisional semiconductor integrated circuit device (a provisional microcontroller) 20 is manufactured. However, in this process, a program is yet stored in the programmable ROM (OTP) 15 and storing the program in programmable ROM (OTP) 15 will be carried out by the user side in the manner which will later be described.

The semiconductor maker provides the user with a plurality of provisional microcontrollers 20 which are similar in structure to one another and which are manufactured in the manner as described above.

It is noted in this process that the provisional microcontrollers 20 provided to the user are different from provisional microcontrollers provided to the user in the conventional method of manufacturing the microcontroller. That is, in the conventional method of manufacturing the microcontroller, each of the provisional microcontrollers provided to user comprises a semiconductor chip comprising a CPU, an RAM, an OTP, and an input/output control LSI that is sealed with a semiconductor package. On the other hand, in the exemplary embodiment of this invention, each of the provisional microcontrollers provided to the user comprises the first semiconductor chip 10 comprising the CPU, the RAM, the mask ROM 11, and the input/output LSI and a second semiconductor chip consisting of the programmable ROM (OTP) 15 stacked on the first semiconductor chip 10 that are sealed with the same semiconductor package 17.

Furthermore, it is noted that the provisional microcontrollers 20 provided to the user are different from the multi chip packages disclosed in the above-mentioned US 2002/0027281 A1 and are strictly provisional ones (i.e. semifinished products) but are not ultimate products. In other words, according to this invention, the multi chip packages (the provisional microcontrollers) as disclosed in US 2002/0027281 A1 are provisionally used in order to manufacture the ultimate microcontrollers. However, in a case where the volume of production is few, the provisional microcontrollers may be provided to the user as the ultimate products as required from the user.

Figure 4:
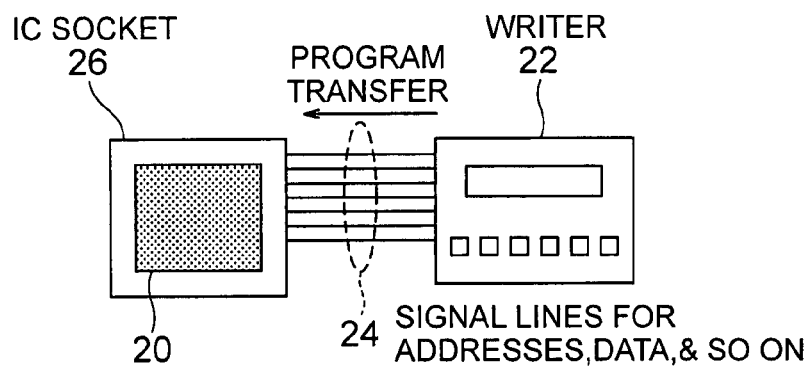
FIG. 4 is a block diagram showing a state where a provisional program is written in the programmable ROM of the first semiconductor integrated circuit device (the first controller) illustrated in FIG. 3.

As shown in FIG. 4, the user stores, using an ERPOM programmer (writer) 22, a provisional program (i.e. a program which is debugged by using the software emulator) in the programmable ROM (OTP) 15 in one of the provisional microcontrollers 20 provided from the semiconductor maker. More specifically, the provisional program is stored in the programmable ROM (OTP) 15 by inserting the above-mentioned one of the provisional microcontrollers 20 into an IC socket 26 which is connected to the EPROM programmer (writer) 11 via signal lines 24 for addresses, data, and so on and by transferring the provisional program to it from the EPROM programmer (writer) 22 via the signal lines 24 and the IC socket 26.

Figure 5:
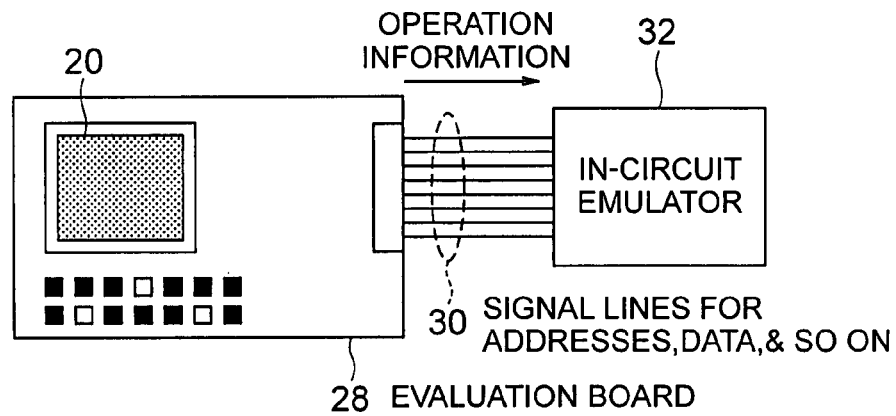
FIG. 5 is block diagram showing a state for testing operation of the first semiconductor integrated circuit device (the first microcontroller) where the provisional program is stored in the programmable ROM.

Subsequently, as shown in FIG. 5, the user carries out a test of the provisional program by mounting the provisional microcontroller 20 in which the above-mentioned provisional program is stored on an equipment (a target board). That is, the test of the provisional program is carried out by mounting the provisional microcontroller 20 in which the provisional program is stored on an evaluation board 28 serving as the target board and by verifying a functional operation of the evaluation board 28 by using an in-circuit emulator 32 which is connected to the evaluation board 28 via signal lines 30 for addresses, data, and so on.

Herein, as described above, the OTP 15 can allow to write information therein only once. Accordingly, when any place to be corrected (any error) finds in the provisional program by the above-mentioned test, the user stores a corrected provisional program in an OTP 15 of a different provisional microcontroller 20 (FIG. 4) and carries out retest and re-correction of the corrected provisional program (FIG. 5). That is, the user repeatedly carries out the test (the retest) and the correction (the re-correction) of the provisional program. By repeating operation of the test (the retest) and the correction (the re-correction) of the provisional program, an ultimate program is determined in the user side.

In the conventional method of manufacturing the microcontroller, the semiconductor maker carries out the design of the product (the provisional microcontroller) of the OTP version, provides the user with the provisional microcontrollers, and then carries out design of a product (an actual microcontroller) of a mask ROM version. On the other hand, in the method of manufacturing the microcontroller according to this invention, the semiconductor maker directly carries out the design of the product of the mask ROM version without carrying out design of a product of an OTP version. Accordingly, it is unnecessary for this invention to carry out the design of the product of the mask ROM version anew in this stage. In other words, at this stage, the design of the product of the mask ROM version already finishes, and design of an actual semiconductor integrated circuit board (an actual microcontroller board) 100 is already completed. However, the pre-designed actual semiconductor integrated circuit board (the pre-designed actual microcontroller board) 100 is different from the provisional semiconductor integrated circuit board (the provisional microcontroller board) 10 illustrated in FIG. 1 and avoids the necessity for stacking the OTP 16 on an actual mask ROM 110.

Figure 7:
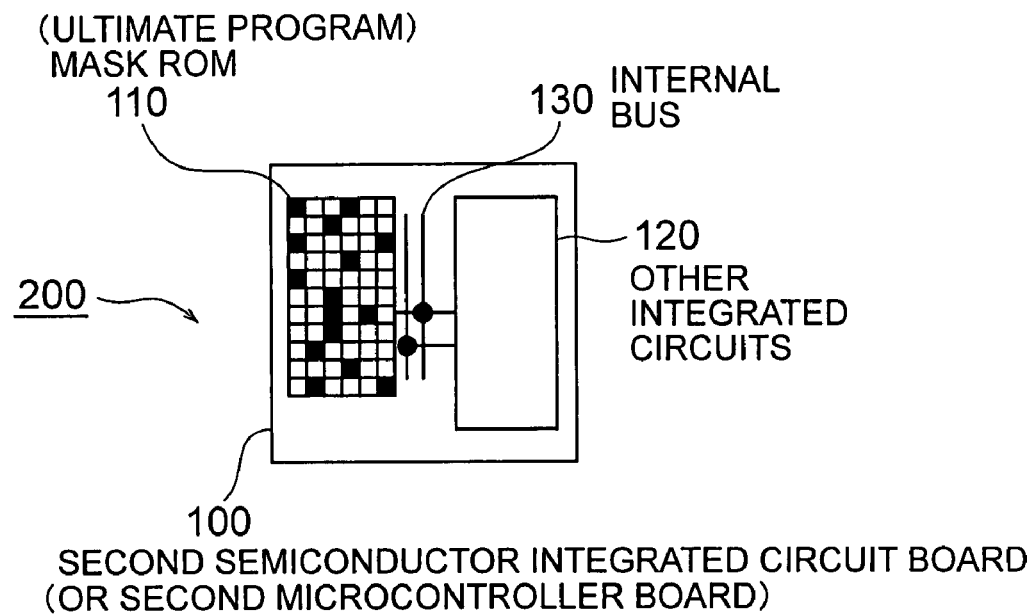
FIG. 7 is a schematic plan view showing the second semiconductor integrated circuit device (the second microcontroller) where the mask ROM in which the ultimate program is stored in FIG. 6 is electrically connected to an internal bus.

The pre-designed actual semiconductor integrated circuit board (the pre-designed actual microcontroller board) 100 comprises the actual mask ROM 110 and other integrated circuits 120 which are incorporated in a one chip (see FIG. 7). The other integrated circuits 120 comprise a CPU, an RAM, and an input/output control LSI. However, in this stage, the actual mask ROM 110 of the pre-designed semiconductor integrated circuit board (the pre-designed microcontroller) 100 has yet an ultimate program stored therein and is not connected to an actual internal bus 130. The actual semiconductor integrated circuit board (the actual microcontroller board) 100 is also called a second semiconductor integrated circuit board (a second microcontroller board), the actual ROM 110 is also called a second mask ROM, and the accrual internal bus 130 is also called a second internal bus.

The user delivers or provides the semiconductor maker with the above-mentioned determined ultimate program.

Figure 6:
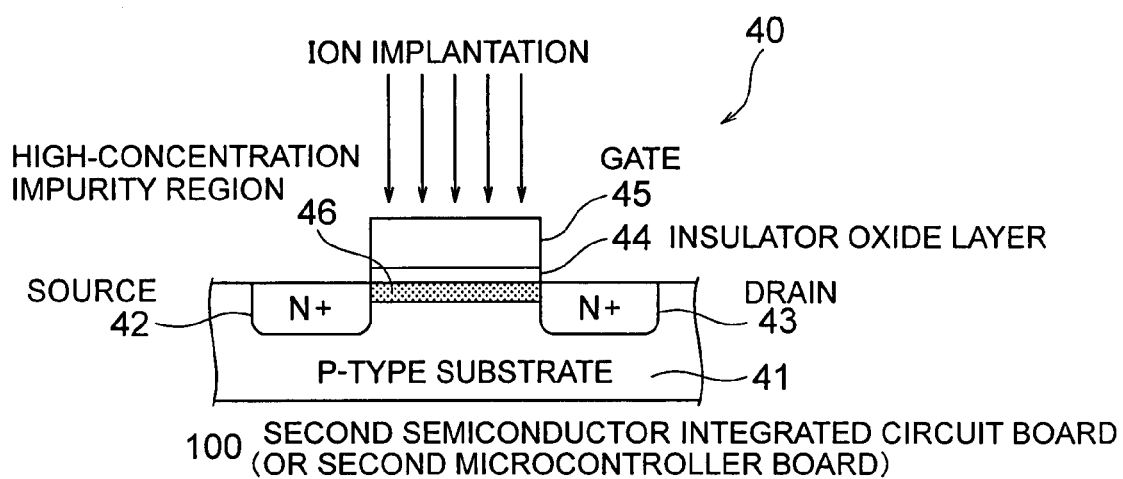
FIG. 6 is a cross sectional view of a memory cell showing a state for writing, by ion implantation, an ultimate program in the mask ROM constituting a second semiconductor integrated circuit board (a second microcontroller board)

As shown in FIG. 6, the semiconductor maker stores, by using ion implantation, the ultimate program in the second mask ROM 130 of the second semiconductor integrated circuit board (the second microcontroller board) 100.

FIG. 6 shows structure of a memory cell 40 in the mask ROM 130. The illustrated memory cell 40 comprises an N-channel MOS transistor. More specifically, the memory cell 40 comprises a P-type substrate 41 and two N+ regions 42 and 43 diffused in the P-type substrate 41. One N+ region 42 serves as a source while another N+ region 43 serves as a drain. On a surface of the P-type substrate 41, an area between the drain 43 and the source 42 is covered with an insulator oxide layer 44 and a metal electrode 45 is adhesive thereon. The metal electrode 45 serves as a gate. Immediately below the gate 45, a high-concentration impurity region 46 is formed. In a process of semiconductor manufacturing technique, turning on/off of the memory cell 40 is carried out by controlling the high-concentration impurity region 46 immediately below the gate 45 using the ion implantation.

Thereafter, as shown in FIG. 7, the semiconductor maker electrically connects the second internal bus 130 with the second mask ROM 110 in which the ultimate program is stored by using metal wires to manufacture a second microcontroller 200 as the ultimate product. The second microcontroller 200 is also called a second semiconductor integrated circuit device. The second microcontroller 200 manufactured in the manner which is described above is sealed with a semiconductor package (see FIG. 3) and is in volume production. The mass-produced ultimate second microcontrollers 200 are provided to the user.

The user mounts the provided ultimate second microcontrollers 200 on respective equipments (electronic devices) to produce the equipments (electronic devices) in volume.

In the manner which is described above, inasmuch as the semiconductor maker carries out design only one kind of products in the method of manufacturing the microcontroller 200 according to the exemplary embodiment of this invention, it is possible to develop the microcontroller 200 as the ultimate product in a short time (e.g. about half year).

Figure 8:
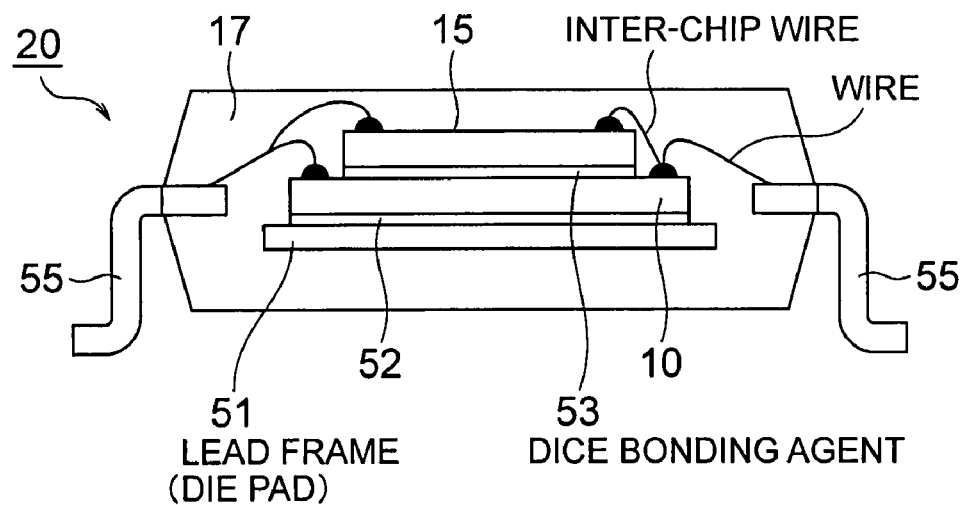
FIG. 8 is a cross sectional view showing the first semiconductor integrated circuit device (the first microcontroller) illustrated in FIG. 3 in detail.
Figure 9:
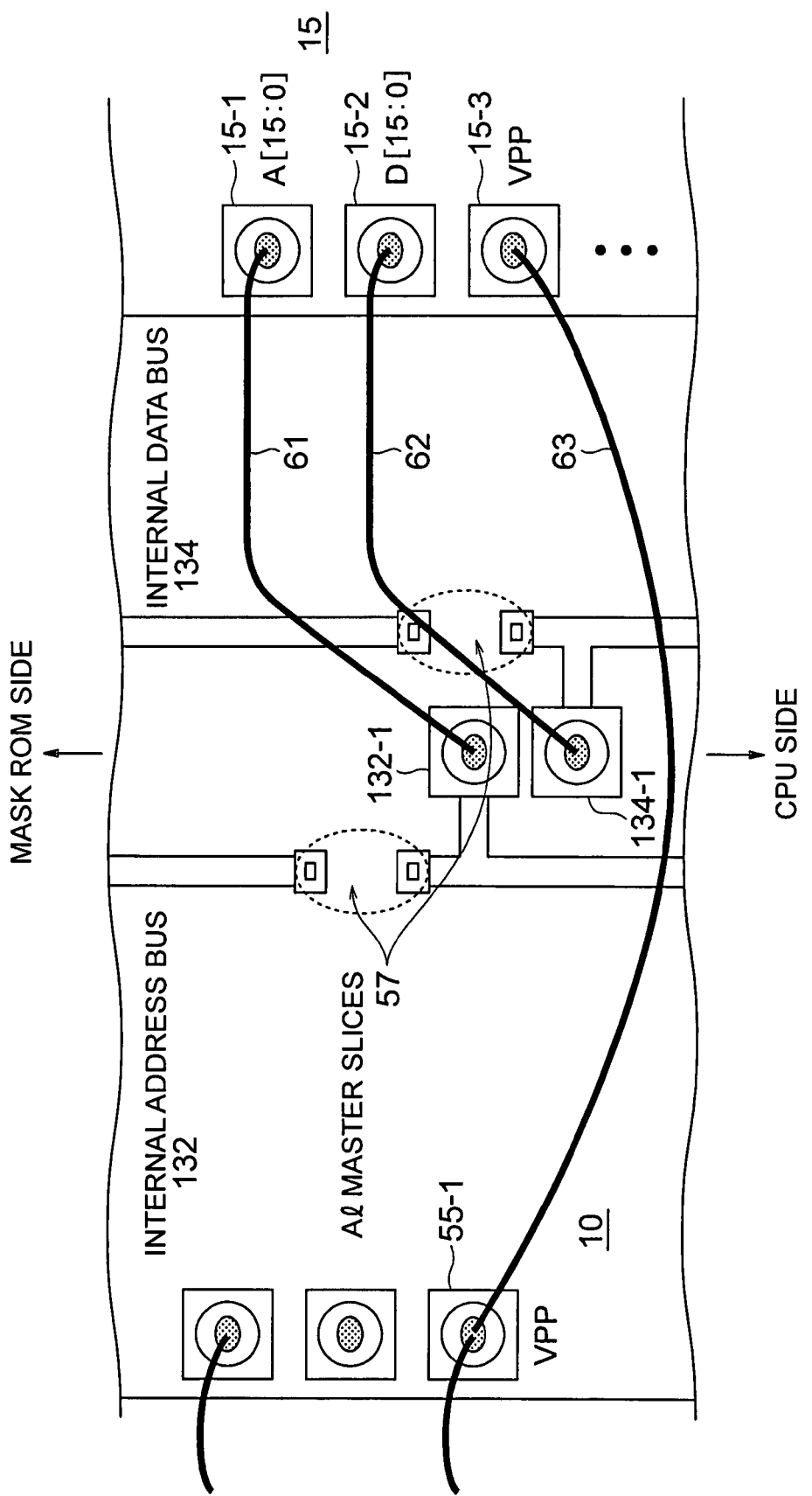
FIG. 9 is a fragmentary plan view for use in describing a state where the mask ROM and the internal bus are physically separated from each other.

Referring now to FIGS. 8 and 9, the description will proceed to a first disconnecting method for electrically detach the first mask ROM 11 from the first internal bus 13 in the connecting process illustrated in FIG. 2.

FIG. 8 is a cross sectional view showing the provisional integrated circuit device (the provisional microcontroller) 20 shown in FIG. 3 in more detail. The first semiconductor integrated circuit board (the first microcontroller board) 10 is bonded on a lead frame (a die pad) 51 through dice bonding agent 52. The programmable ROM (OTP) 15 is bonded (stacked) on the mask ROM 11 of the first semiconductor integrated circuit board (the microcontroller board) 10 through dice bonding agent 53. The first semiconductor integrated circuit board (the first microcontroller board) 10 and the programmable ROM (OTP) 15 are sealed in the same semiconductor package 17 with the programmable ROM (OTP) 15 stacked on the first semiconductor integrated circuit board (the first microcontroller board) 10. A plurality of leads 55 are disposed (or extended) from the semiconductor package 17.

Herein, the lead frame 51 is also called a wiring board while the leads 55 are also called outer leading wires or outer leading leads. At any rate, the wiring board 51 has a plurality of outer leading wires (outer leading leads) 55.

Referring to FIG. 9, the first internal bus 13 comprises an internal address bus 132 and an internal data bus 134. The first mask ROM 11 and the first internal bus 13 are electrically separated from each other by Al master slices 57.

Internal address bonding pads 132-1 are led from the internal address bus 132 while internal data bonding pads 134-1 are led from the internal data bus 134. The internal address bonding pads 132-1 and the internal data bonding pads 134-1 are collectively called bus connecting terminals.

On the other hand, the programmable ROM (OTP) 15 comprises address bonding pads 15-1, data bonding pads 15-2, and a power supply bonding pad 15-3. The address bonding pads 15-1, the data bonding pads 15-2, and the power supply bonding pad 15-3 are collectively called ROM connecting terminals.

One of the plurality of leads 55 is a power supply bonding pad 55-1. The address bonding pads 15-1 of the programmable ROM (OTP) 15 are electrically connected to the internal address bonding pads 132-1 through bonding wires 61. The data bonding pads 15-2 of the programmable ROM (OTP) 15 are electrically connected to the internal data bonding pads 134-1 through bonding wires 62. The power supply bonding pad 15-3 of the programmable ROM (OTP) 15 is electrically connected to the power supply bonding pad 55-1 through a bonding wire 63.

In the first disconnecting method illustrated in FIG. 9, an electrical separation between the first ROM 11 and the first internal bus 13 is physically carried out by the Al master slices 57. In other words, the first disconnecting method uses a wiring layer and switches use/intact of the first mask ROM 11 by pattern change of the wiring layer.

Figure 10:
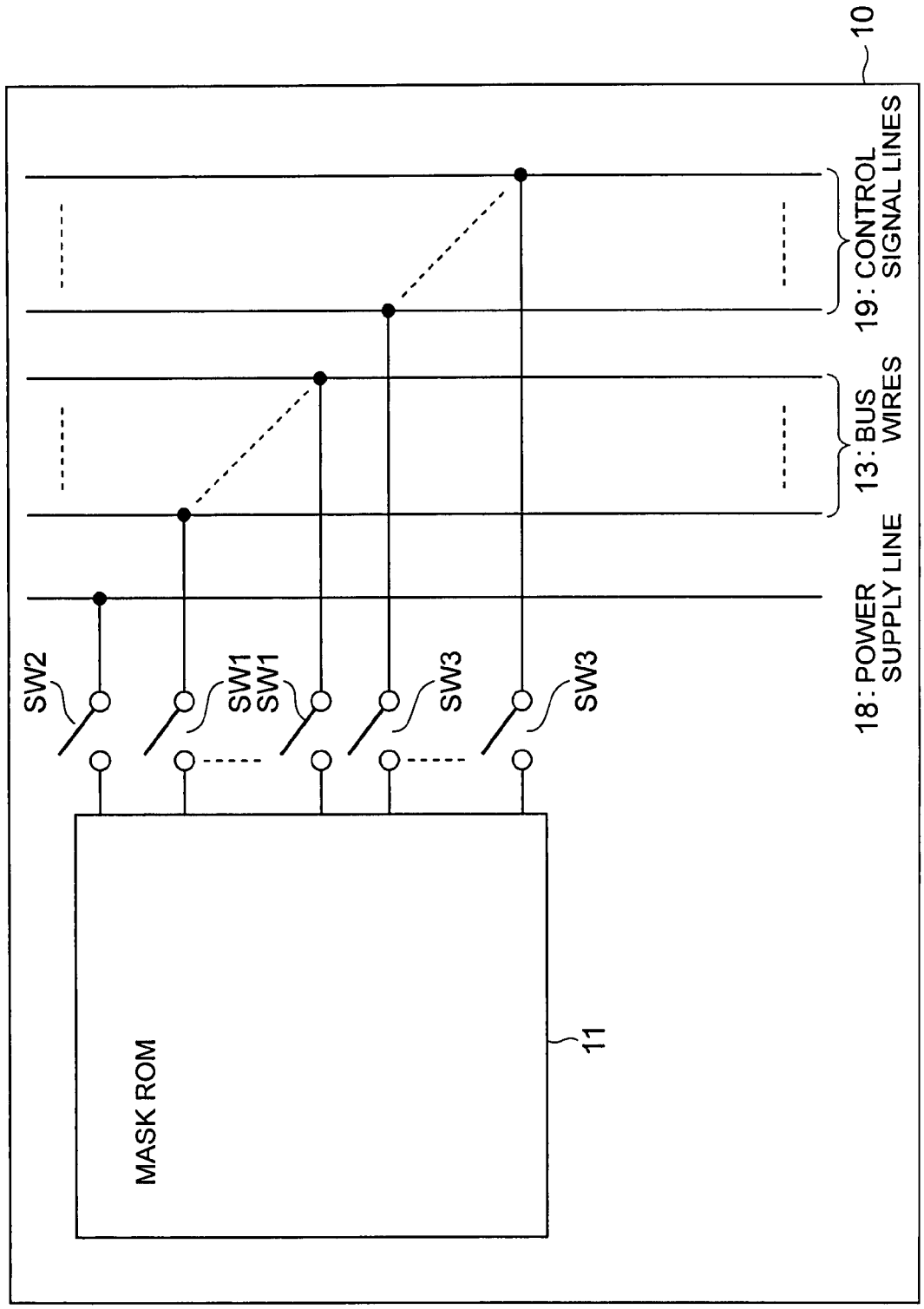
FIG. 10 is a block diagram showing the mask ROM and the internal bus for use in describing an example where the mask ROM and the internal bus are electrically separated from each other.

Referring to FIG. 10, the description will proceed to a second disconnecting method of electrically separating the first mask ROM 11 from the first internal bus 13. The first mask ROM 11 and the first internal bus 13 are connected to each other through a plurality of first switches SW1. In the example being illustrated in FIG. 10, the first mask ROM 11 and a power supply line 18 are connected to each other through a second switch SW2 while the first mask ROM 11 and a plurality of control signal lines 19 are connected to each other through a plurality of third switches SW3. Each of the illustrated switches SW1, SW2, and SW3 comprises a MOS switch.

Control signals to be supplied from the control signal lines 19 to the first mask ROM 11 include signals for controlling a read-out operation of the first mask ROM 11, a clock signal, and so on. In addition, in a case where the mask ROM 11 comprises a plurality of banks, the above-mentioned control signals include a signal for selecting one from the plurality of banks.

It is possible to switch use/intact of the first mask ROM 11 by controlling turning on/off of the MOS switches SW1, SW2, and SW3 by using selection signals supplied from a control circuit (not shown). That is, the second disconnecting method shown in FIG. 10 electrically carries out the electrical separation between the first mask ROM 11 and the first internal bus 13 by using the MOS switches SW1.

Although electrical connection/disconnection between the power supply line 18 and the first mask ROM 11 and between the control signal lines 19 and the first mask ROM 11 are controlled by using the second switch SW2 and the third switches SW3 in the example illustrated in FIG. 10, the second and the third switches SW2 and SW3 may be omitted.

Figure 11:
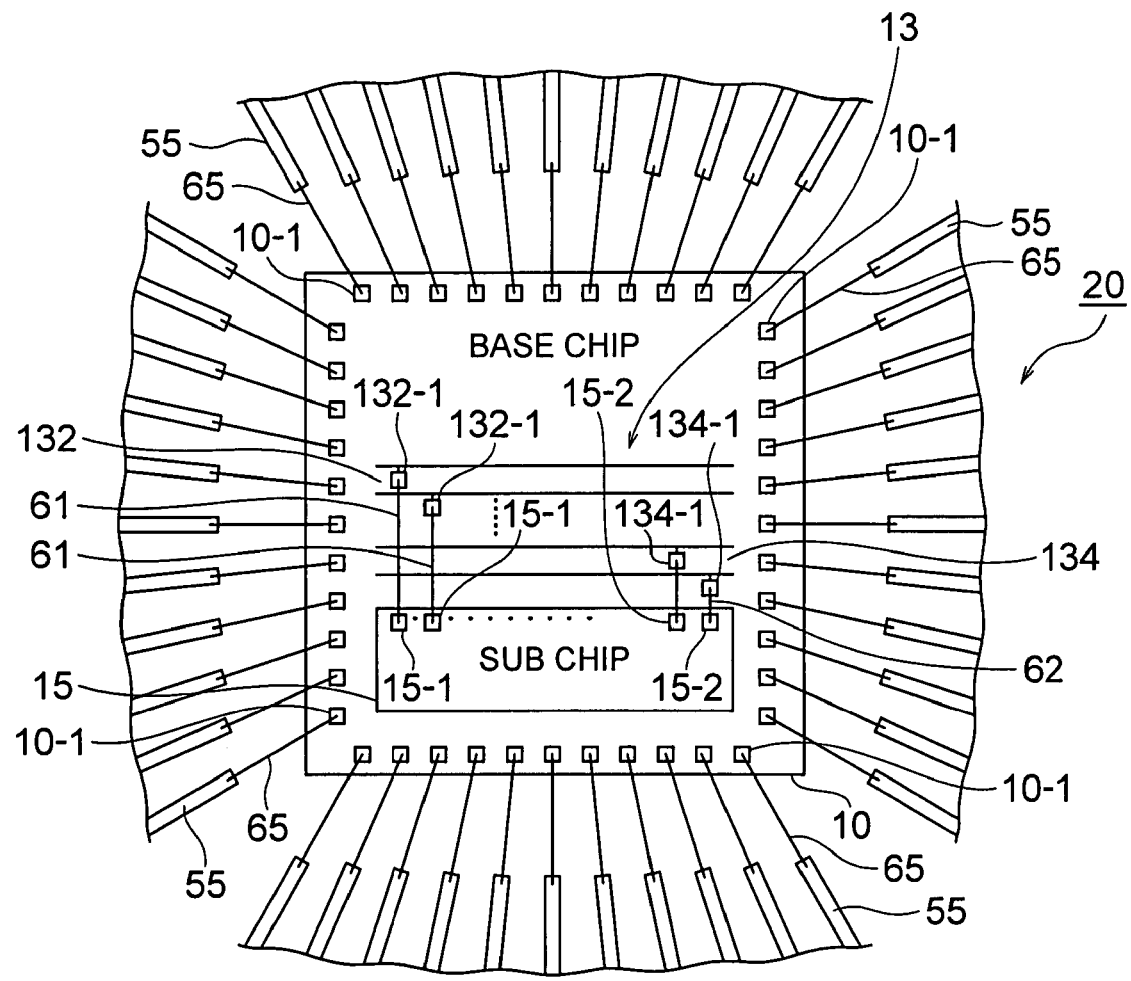
FIG. 11 is a schematic plan view showing the first semiconductor integrated circuit device (the first microcontroller) with the semiconductor package removed in order to describe a first electrical connection method according to a first exemplary embodiment of this invention.

Referring now to FIG. 11, the description will proceed to a first electrical connection method for electrically connecting the programmable ROM (OTP) 15 with the first internal bus 13 using the wire bonding technique. FIG. 11 is a schematic plan view showing the first semiconductor integrated circuit device (the provisional microcontroller) 20 with the semiconductor package 17 removed in order to describe the first electrical connection method of this exemplary embodiment of this invention.

The semiconductor integrated circuit device 20 comprises the first semiconductor integrated circuit board 10 and the programmable ROM (OTP) 15 stacked on the first semiconductor integrated circuit board 10. The first semiconductor integrated circuit board 10 is also called a base chip while the programmable ROM (OTP) 15 is also called a sub chip.

The first semiconductor integrated circuit board 10 comprises an area in which the mask ROM 11 (see FIG. 1) is formed. Such an area is called a mask ROM area hereunder. The programmable ROM (OTP) 15 is stacked on the first semiconductor integrated circuit board 10.

The first semiconductor integrated circuit board 10 further comprises the first internal bus 13. The first internal bus 13 comprises the internal address bus 132 and the internal data bus 134.

The internal address bonding pads 132-1 are led from the internal address bus 132 while the internal data bonding pads 134-1 are led from the internal data bus 134. The internal address bonding pads 132-1 and the internal data bonding pads 134-1 are collectively called the bus connecting terminals in the manner which is described above.

On the other hand, the programmable ROM (OTP) 15 has the address bonding pads 15-1 and the data bonding pads 15-2. The address bonding pads 15-1 and the data bonding pads 15-2 are collectively called the ROM connecting terminals in the manner which is described above.

The address bonding pads 15-1 of the programmable ROM (OTP) 15 are electrically connected to the internal address bonding pads 132-1 via the bonding wires 61 while the data bonding pads 15-2 of the programmable ROM (OTP) 15 are electrically connected to the internal address bonding pads 134-1 via the bonding wires 62. That is, the bus connecting terminals (132-1, 134-1) and the ROM connecting terminals (15-1, 15-2) are wire-bonded by using the bonding wires (61, 62).

In addition, the first semiconductor integrated circuit board (the first microcontroller board) 10 and the programmable ROM (OTP) 15 are sealed in the same semiconductor package 17 (see FIG. 8) with the programmable ROM (OTP) 15 stacked on the first semiconductor integrated circuit board (the first microcontroller board) 10. The plurality of leads (terminals) 55 are disposed or extended from the semiconductor package 17. The leads 55 are also called package pins.

The base chip 10 has a plurality of base bonding pads 10-1 on the periphery thereof. The base bonding pads 10-1 are also called board connecting terminals. The plurality of base bonding pads (board connecting terminals) 10-1 are electrically connected to the plurality of leads (outer leading wires, outer leading leads) 55 of the lead frame (wiring board) 51 via a plurality of bonding wires 65, respectively.

In the manner which is described above, the wire bonding is directly carried out from the ROM connecting terminals 15-1, 15-2 of the sub chip 15 to the bus wires (the first internal bus) 13 in the base chip 10. With this structure, it is possible to decrease the number of terminals of the semiconductor package 17 and it is possible to prevent an input/output area of the base chip from increasing. In addition, configuration of the package pins 55 of the first semiconductor integrated circuit device 20 is compatible with configuration of package pins of the second semiconductor integrated circuit device 200 using only the base chip 100 as shown in FIG. 7. As a result, the first semiconductor integrated circuit device 20 and the second semiconductor integrated circuit device 200 are compatible for reliability with each other.

Figure 12:
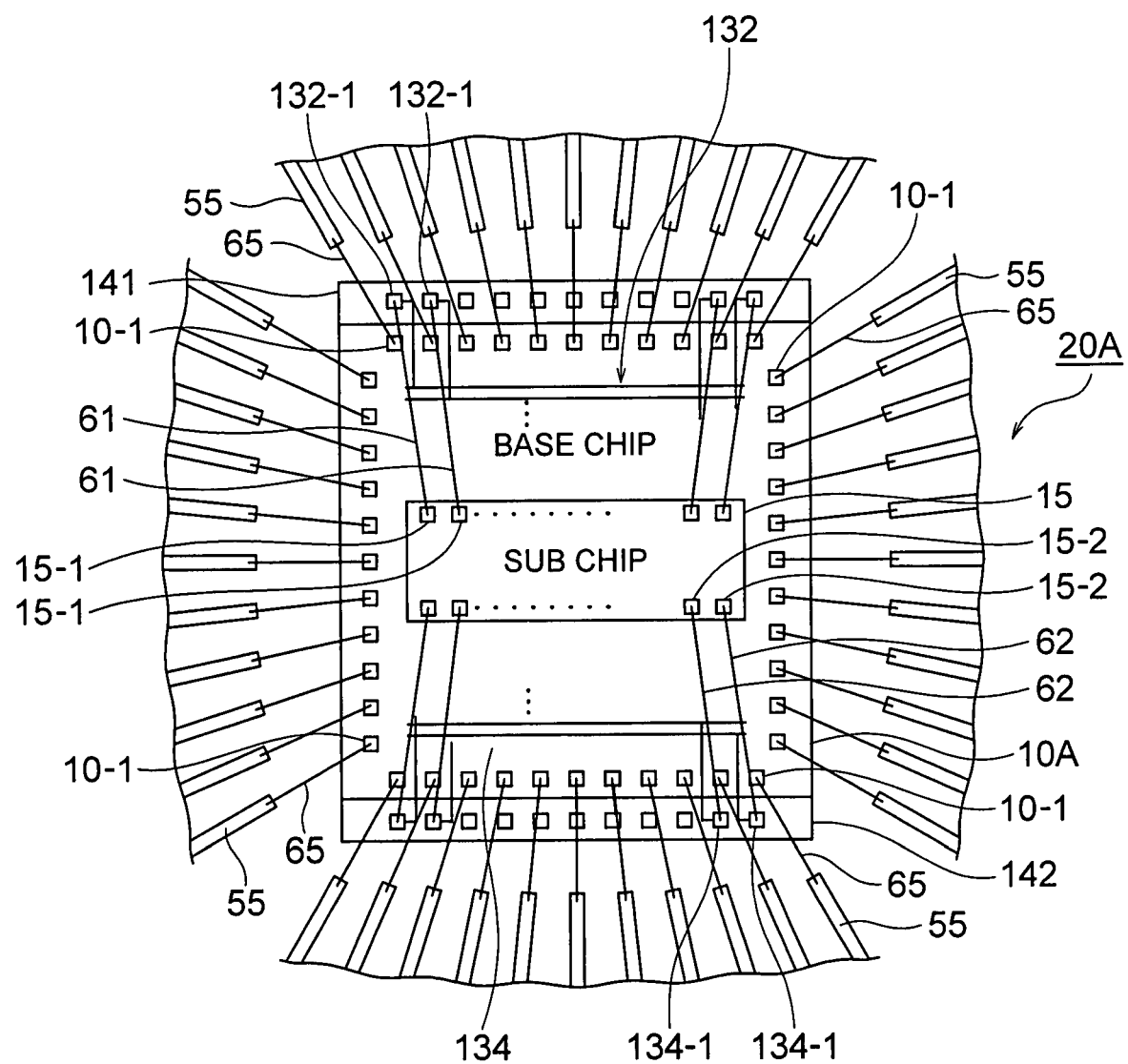
FIG. 12 is a schematic plan view showing the first semiconductor integrated circuit device (the first microcontroller) with the semiconductor package removed in order to describe a second electrical connection method according to a second exemplary embodiment of this invention.

Referring now to FIG. 12, the description will proceed to a second electrical connection method for electrically connecting the programmable ROM (OTP) 15 with the first internal bus 13 by using the wire bonding technique. FIG. 12 is a schematic plan view showing a first semiconductor integrated circuit device (a first microcontroller) 30A with the semiconductor package 17 removed in order to describe the second electrical connection method according to the exemplary embodiment of this invention.

The first semiconductor integrated circuit device (the first microcontroller) 20A shown in FIG. 12 is similar in structure to the first semiconductor integrated circuit device (the first microcontroller) 20 shown in FIG. 11 except that positions for forming the internal address bonding pads 132-1 led from the internal address bus 132 and the internal data bonding pads 134-1 led from the internal data bus 134 are different from those illustrated in FIG. 11 in the manner which will later be described. The same reference symbols are attached to those having similar functions of those illustrated in FIG. 11.

The first semiconductor integrated circuit device 20A comprises a first semiconductor integrated circuit board 10A and the programmable ROM (OTP) 15 stacked on the first semiconductor integrated circuit board 10A. The first semiconductor integrated circuit board 10A is also called the base chip while the programmable ROM (OTP) 15 is also called the sub chip.

The first semiconductor integrated circuit board 10A comprises an area in which the mask ROM 11 (see FIG. 1) should be formed. Such an area is called the mask ROM area. The programmable ROM (OTP) 15 is stacked on the first semiconductor integrated circuit board 10A.

The first semiconductor integrated circuit board 10A further comprises the first internal bus 13. The first internal bus 13 comprises the internal address bus 132 and the internal data bus 134.

Around the periphery of the first semiconductor integrated circuit board 10A, an internal address pad area 141 in which the internal address bonding pads 132 are formed and an internal data pad area 142 in which the internal data bonding pads 134 are formed are added.

The internal address pad area 141 and the internal data pad area 142 are added only when the sub chip 15 is stacked on the first semiconductor integrated circuit board 10A and the internal address pad area 141 and the internal data pad area 142 are separated when only the base chip 100 is used as shown in FIG. 7.

On the other hand, the programmable ROM (OTP) 15 has the address bonding pads 15-1 and the data bonding pads 15-2. The address bonding pads 15-1 and the data bonding pads 15-2 are collectively called input/output terminals or the ROM connecting terminals.

The address bonding pads 15-1 of the programmable ROM (OTP) 15 are electrically connected to the internal address bonding pads 132-1 via the bonding wires 61 while the data bonding pads 15-2 of the programmable ROM (OTP) 15 are electrically connected to the internal data bonding pads 134-1 via the bonding wires 62.

In addition, the first semiconductor integrated circuit board (the first microcontroller board) 10A, the internal address pad area 141, the internal data pad area 142, and the programmable ROM (OTP) 15 are sealed in the same semiconductor package 17 (see FIG. 8) with the programmable ROM (OTP) 15 stacked on the first semiconductor integrated circuit board (the first microcontroller board) 10A. The plurality of leads (terminals) 55 are disposed or extended from the semiconductor package 17. The leads 55 are called the package pins.

The base chip 10A has the plurality of base bonding pads 10-1 on the periphery thereof. The plurality of base bonding pads 10-1 are electrically connected to the plurality of leads (terminals) 55 of the semiconductor package 17 via the plurality of bonding wires 65, respectively.

In the manner which is described above, the wire bonding is carried out from the input/output terminals 15-1 and 15-2 of the sub chip 15 to the bus wires (the first internal bus) 13 in the base chip 10A. With this structure, it is possible to decrease the number of terminals of the semiconductor package 17 and it is possible to prevent the input/output area of the base chip 10A from increasing. In addition, configuration of the package pins 55 of the first semiconductor integrated circuit device 20A is compatible with configuration of package pins of the second semiconductor integrated circuit device 200 using only the base chip 100 as shown in FIG. 7. As a result, the first semiconductor integrated circuit device 20A and the second semiconductor integrated circuit device 200 are compatible for reliability with each other. Furthermore, inasmuch as the internal address pad area 141 and the internal data pad area 142 are deleted on using only the base chip 100, it is possible to prevent a chip area from increasing on using only the base chip 100.

Figure 13:
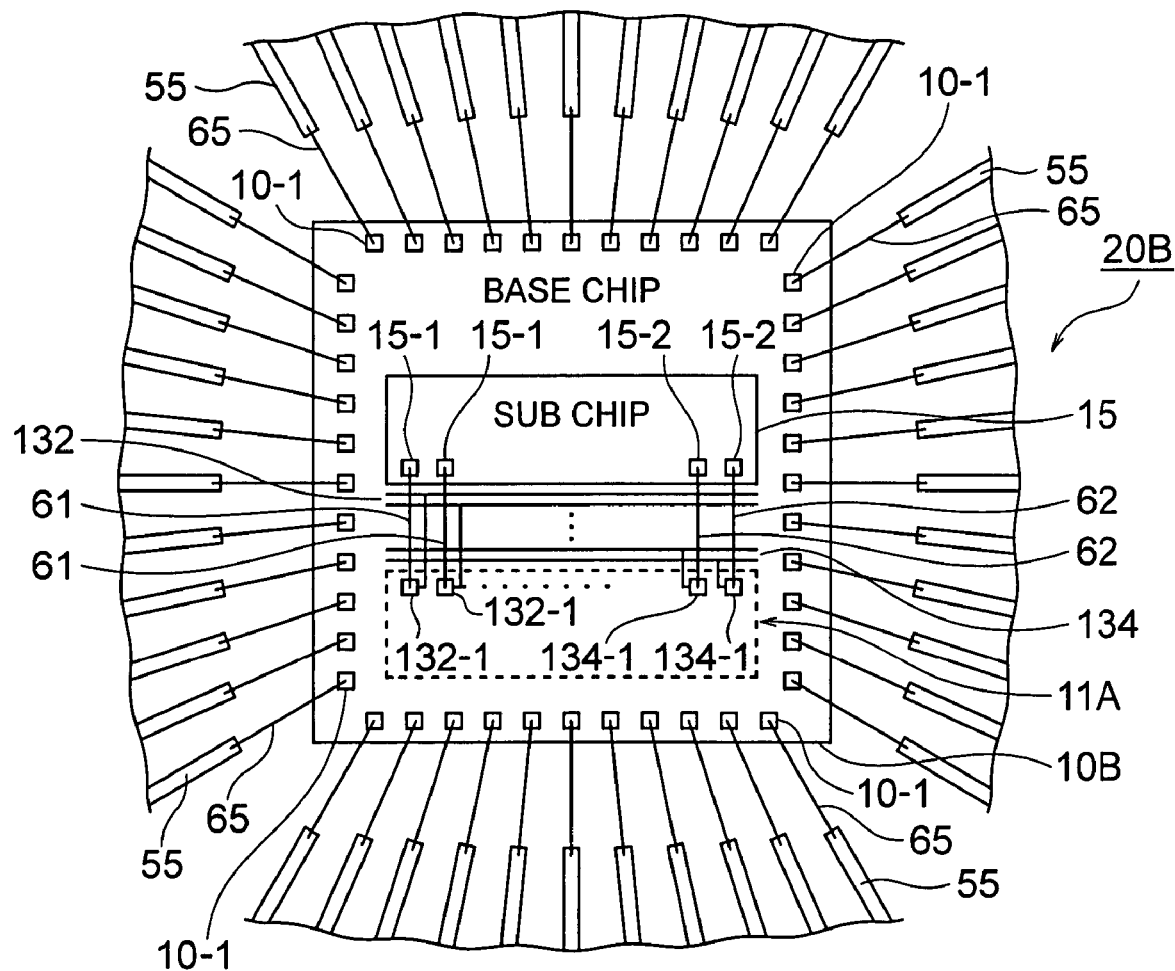
FIG. 13 is a schematic plan view showing the first semiconductor integrated circuit device (the first microcontroller) with the semiconductor package removed in order to describe a third electrical connection method according to a third exemplary embodiment of this invention.

Referring now to FIG. 13, the description will proceed to a third electrical connection method for electrically connecting the programmable ROM (OTP) 15 with the first internal bus 13 by using the wire bonding technique. FIG. 13 is a schematic plan view showing a first semiconductor integrated circuit device (a first microcontroller) 20B with the semiconductor package 17 removed in order to describe the third electrical connection method according to the embodiment of this invention.

The first semiconductor integrated circuit device (the first microcontroller) 20B shown in FIG. 13 is similar in structure to the first semiconductor integrated circuit device (the first microcontroller) 20 shown in FIG. 11 except that positions for forming the internal address bonding pads 132-1 led from the internal address bus 132 and the internal data bonding pads 134-1 led from the internal data bus 134 are different from those illustrated in FIG. 11 in the manner which will later be described. The same reference symbols are attached to those having similar functions of those illustrated in FIG. 11.

The first semiconductor integrated circuit device 20B comprises a first semiconductor integrated circuit board 10B and the programmable ROM (OTP) 15 stacked on the first semiconductor integrated circuit board 10B. The first semiconductor integrated circuit board 10B is also called the base chip while the programmable ROM (OTP) 15 is also called the sub chip.

The first semiconductor integrated circuit board 10B comprises an area 11A in which the mask ROM 11 (see FIG. 1) should be formed. Such an area 11A is called the mask ROM area. The programmable ROM (OTP) 15 is stacked on the first semiconductor integrated circuit board 10B.

The first semiconductor integrated circuit board 10B further comprises the first internal bus 13. The first internal bus 13 comprises the internal address bus 132 and the internal data bus 134.

On the mask ROM area 11A of the first semiconductor circuit board 10B, the internal address bonding pads 132-1 and the internal data bonding pads 134-1 are formed.

On the other hand, the programmable ROM (OTP) 15 comprises the address bonding pads 15-1 and the data bonding pads 15-2. The address bonding pads 15-1 and the data bonding pads 15-2 are collectively called input/output terminals or the ROM connecting terminals.

The address bonding pads 15-1 of the programmable ROM (OTP) 15 are electrically connected to the internal address bonding pads 132-1 via the bonding wires 61 while the data bonding pads 15-2 of the programmable ROM (OTP) 15 are electrically connected to the internal data bonding pads 134-1 via the bonding wires 62.

In addition, the first semiconductor integrated circuit board (the first microcontroller board) 10B and the programmable ROM (OTP) 15 are sealed in the same semiconductor package 17 (see FIG. 8) with the programmable ROM (OTP) 15 stacked on the first semiconductor integrated circuit board (the first microcontroller board) 10B. The plurality of leads (terminals) 55 are disposed or extended from the semiconductor package 17. The leads 55 are called the package pins.

The base chip 10B has the plurality of base bonding pads 10-1 on the periphery thereof. The plurality of base bonding pads 10-1 are electrically connected to the plurality of leads (terminals) 55 of the semiconductor package 17 via the plurality of bonding wires 65, respectively.

In the manner which is described above, the wire bonding is carried out from the input/output terminals 15-1 and 15-2 of the sub chip 15 to the bus wires (the first internal bus) 13 in the base chip 10B. With this structure, it is possible to decrease the number of terminals of the semiconductor package 17 and it is possible to prevent the input/output area of the base chip 10B from increasing. In addition, configuration of the package pins 55 of the first semiconductor integrated circuit device 20B is compatible with configuration of package pins of the second semiconductor integrated circuit device 200 using only the base chip 100 as shown in FIG. 7. As a result, the first semiconductor integrated circuit device 20B and the second semiconductor integrated circuit device 200 are compatible for reliability with each other. Furthermore, inasmuch as the internal address bonding pads 132-1 and the internal data bonding pads 134-1 are deleted on using only the base chip 100 and the mask ROM area 11A is uses as an intrinsic mask ROM 110, it is possible to prevent a chip area from increasing on using only the base chip 100.

Figure 14:
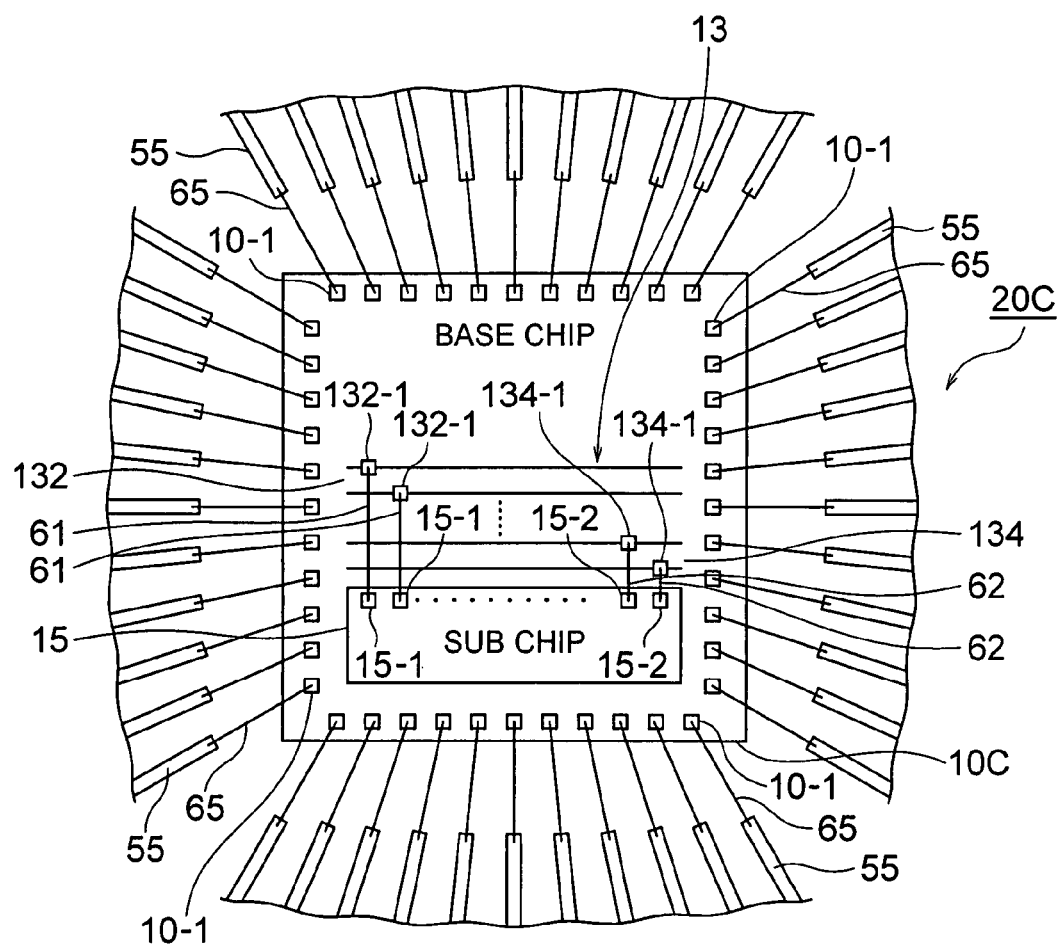
FIG. 14 is a schematic plan view showing the first semiconductor integrated circuit device (the first microcontroller) with the semiconductor package removed in order to describe a fourth electrical connection method according to a fourth exemplary embodiment of this invention.
Figure 15:
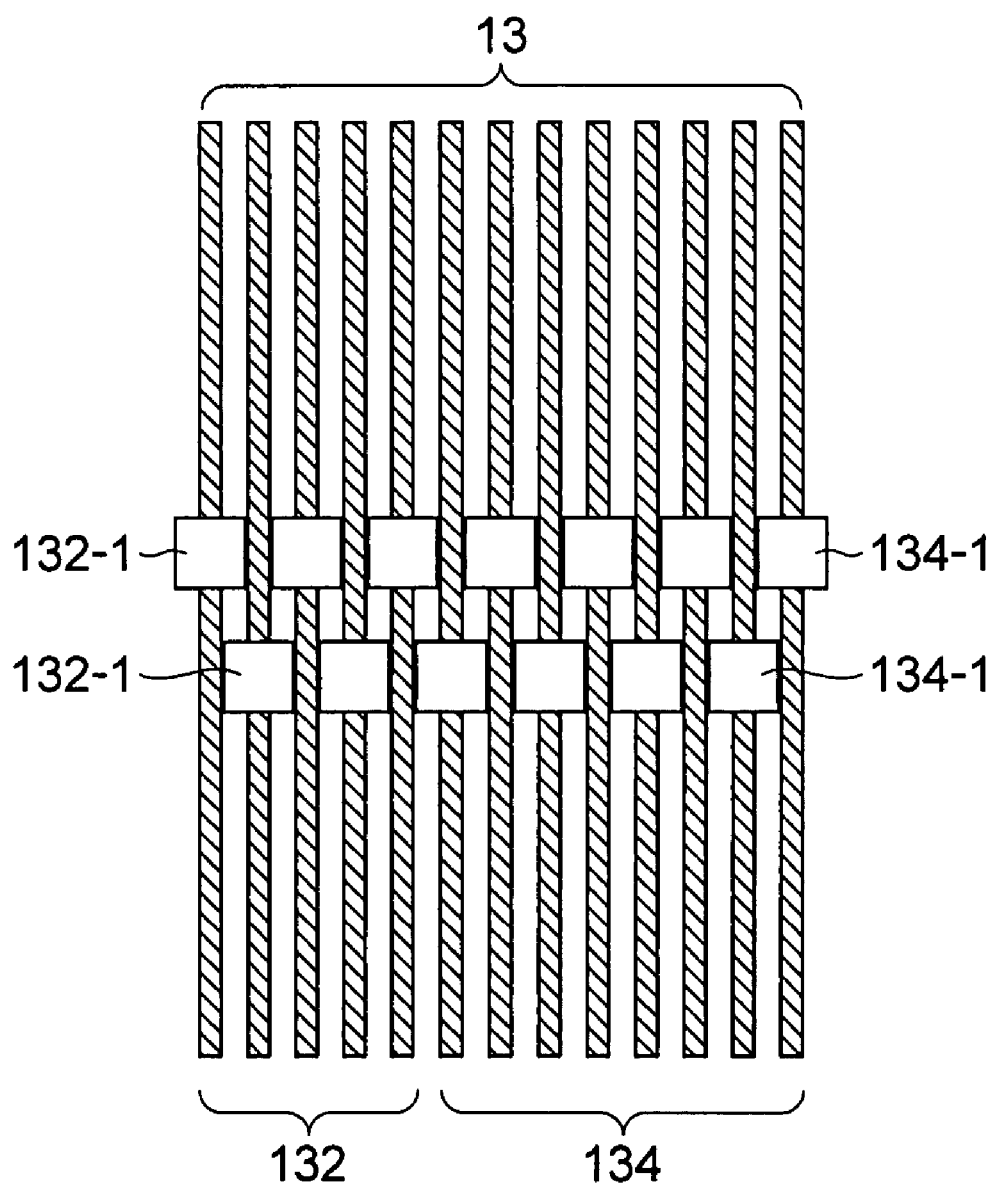
FIG. 15 is a plan view showing configuration of a first internal bus, internal address bonding pads, and internal data bonding pads in the first semiconductor integrated circuit device (the first microcontroller) illustrated in FIG. 14.

Referring now to FIGS. 14 and 15, the description will proceed to a fourth electrical connection method for electrically connecting the programmable ROM (OTP) 15 with the first internal bus 13 by using the wire bonding technique. FIG. 14 is a schematic plan view showing a first semiconductor integrated circuit device (a first microcontroller) 20C with the semiconductor package 17 removed in order to describe the fourth electrical connection method according to the exemplary embodiment of this invention.

The first semiconductor integrated circuit device (the first microcontroller) 20C shown in FIG. 14 is similar in structure to the first semiconductor integrated circuit device (the first microcontroller) 20 shown in FIG. 11 except that positions for forming the internal address bonding pads 132-1 led from the internal address bus 132 and the internal data bonding pads 134-1 led from the internal data bus 134 are different from those illustrated in FIG. 11 in the manner which will later be described. The same reference symbols are attached to those having similar functions of those illustrated in FIG. 11.

FIG. 15 is a plan view showing the placement of the first internal bus 13, the internal address bonding pads 132-1, and the internal data bonding pads 134-1.

The first semiconductor integrated circuit device 20C comprises a first semiconductor integrated circuit board 10C and the programmable ROM (OTP) 15 stacked on the first semiconductor integrated circuit board 10C. The first semiconductor integrated circuit board 10C is also called the base chip while the programmable ROM (OTP) 15 is also called the sub chip.

The first semiconductor integrated circuit board 10C comprises an area in which the mask ROM 11 (see FIG. 1) should be formed. Such an area is called the mask ROM area. The programmable ROM (OTP) 15 is stacked on the first semiconductor integrated circuit board 10B.

The first semiconductor integrated circuit board 10C further comprises the first internal bus 13. The first internal bus 13 comprises the internal address bus 132 and the internal data bus 134.

As shown in FIG. 15, on the first internal bus 13, the internal address bonding pads 132-1 and the internal data bonding pads 134-1 are formed. In the manner which will later be described in detail, the internal address bonding pads 132-1 and the internal data bonding pads 134-1 are formed in a pad-specific wiring layer formed on the first internal bus 13.

On the other hand, the programmable ROM (OTP) 15 comprises the address bonding pads 15-1 and the data bonding pads 15-2. The address bonding pads 15-1 and the data bonding pads 15-2 are collectively called input/output terminals or the ROM connecting terminals.

The address bonding pads 15-1 of the programmable ROM (OTP) 15 are electrically connected to the internal address bonding pads 132-1 via the bonding wires 61 while the data bonding pads 15-2 of the programmable ROM (OTP) 15 are electrically connected to the internal data bonding pads 134-1 via the bonding wires 62.

In addition, the first semiconductor integrated circuit board (the first microcontroller board) 10C and the programmable ROM (OTP) 15 are sealed in the same semiconductor package 17 (see FIG. 8) with the programmable ROM (OTP) 15 stacked on the first semiconductor integrated circuit board (the first microcontroller board) 10C. The plurality of leads (terminals) 55 are disposed or extended from the semiconductor package 17. The leads 55 are called the package pins.

The base chip 10C has the plurality of base bonding pads 10-1 on the periphery thereof. The plurality of base bonding pads 10-1 are electrically connected to the plurality of leads (terminals) 55 of the semiconductor package 17 via the plurality of bonding wires 65, respectively.

In the manner which is described above, the wire bonding is carried out from the input/output terminals 15-1 and 15-2 of the sub chip 15 to the bus wires (the first internal bus) 13 in the base chip 10C. With this structure, it is possible to decrease the number of terminals of the semiconductor package 17 and it is possible to prevent the input/output area of the base chip 10C from increasing. In addition, configuration of the package pins 55 of the first semiconductor integrated circuit device 20C is compatible with configuration of package pins of the second semiconductor integrated circuit device 200 using only the base chip 100 as shown in FIG. 7. As a result, the first semiconductor integrated circuit device 20C and the second semiconductor integrated circuit device 200 are compatible for reliability with each other. Furthermore, inasmuch as the above-mentioned pad-specific wiring layer is deleted on using only the base chip 100, it is possible to prevent processes on manufacturing the chip from increasing on using only the base chip 100.

Figure 16:
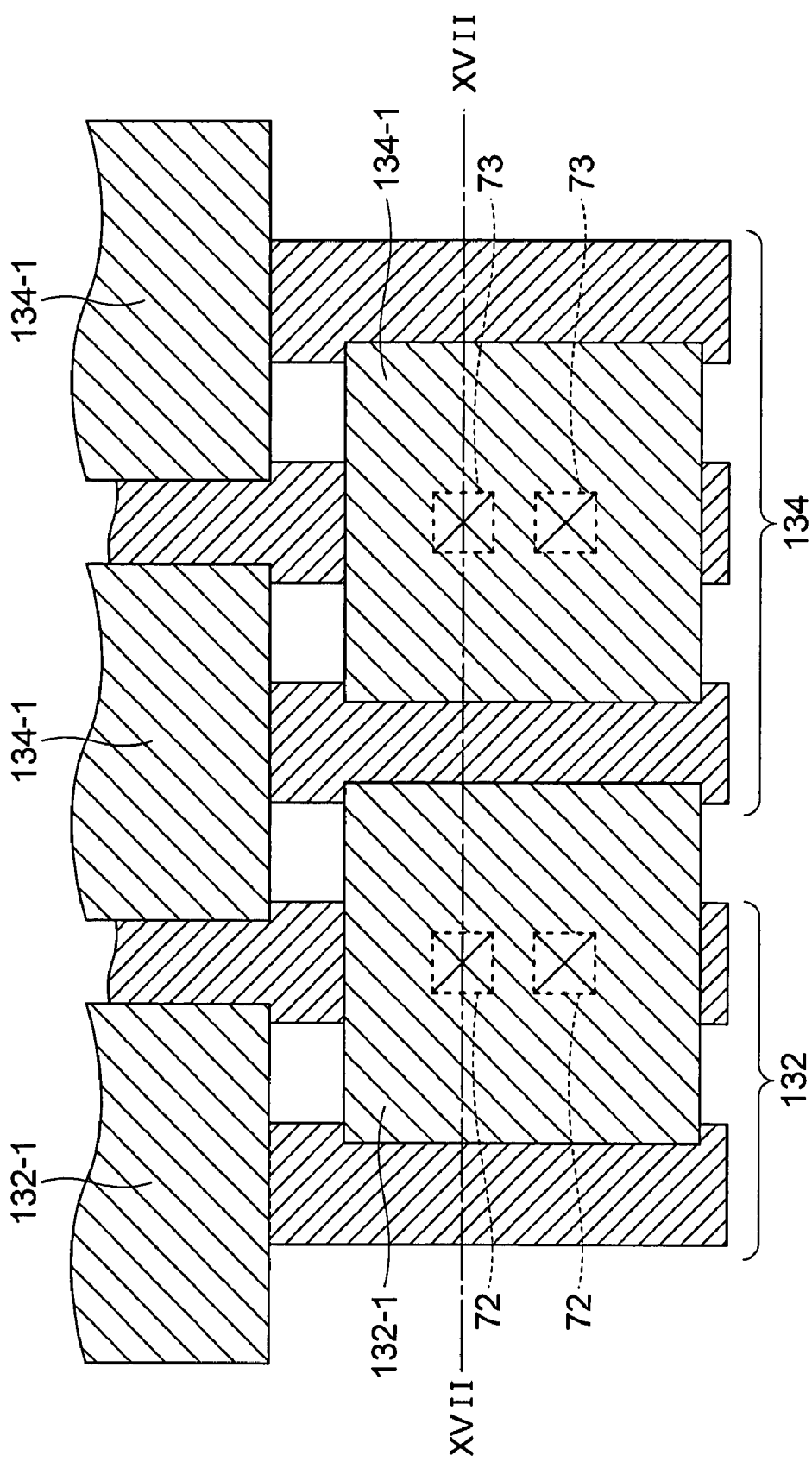
FIG. 16 is a fragmentary plan view, on an enlarged scale, of a portion of FIG. 15.
Figure 17:
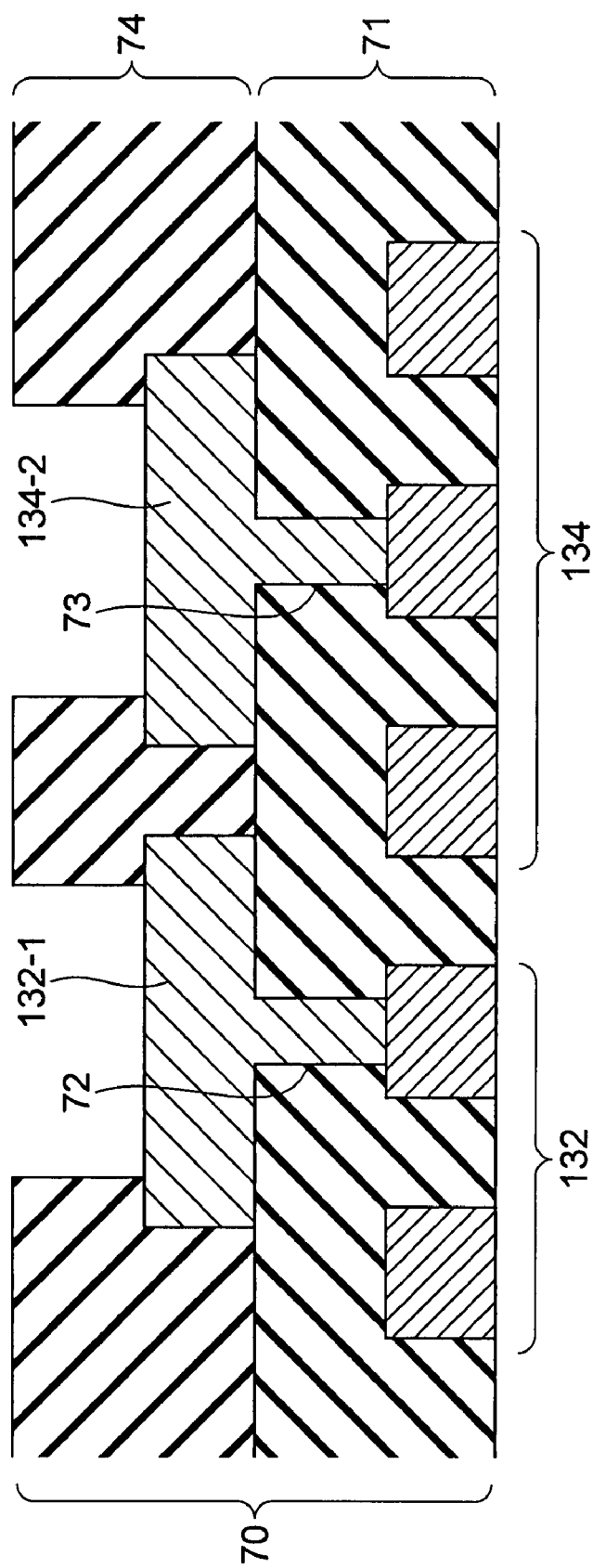
FIG. 17 is a section taken on line XVII-XVII in FIG. 16.

Referring to FIGS. 16 and 17, the description will proceed to the pad-specific wiring layer depicted at 70 formed on the first internal bus 13 in detail. FIG. 16 is a fragmentary plan view, on an enlarged scale, of a portion of FIG. 15. FIG. 17 is a section taken on line XVII-XVII in FIG. 16.

The pad-specific wiring layer 70 comprises a metal interlayer film 71 for covering the first internal bus 13. On the metal interlayer film 71, the internal address bonding pads 132-1 and the internal data bonding pads 134-1 are formed. The internal address bonding pads 132-1 are electrically connected to internal bus wires of the internal address bus 132 through contact holes 72 while the internal data bonding pads 134-1 are electrically connected to internal bus wires of the internal data bus 134 through contact holes 73. The metal interlayer film 71 has an upper surface covered with a passivation film 74 which has openings so as to expose the internal address bonding pads 132-1 and the internal data bonding pads 134-1.

The above-mentioned first through fourth electrically connection methods, which are described with reference to FIGS. 11 through 17, electrically connect the programmable ROM (OTP) 15 with the first internal bus 13 using the wire bonding technique. However, in the manner which will later be described in another exemplary embodiment of this invention, the programmable ROM (OTP) 15 may be electrically connected to the first internal bus 13 using facedown bonding technique.

Figure 18:
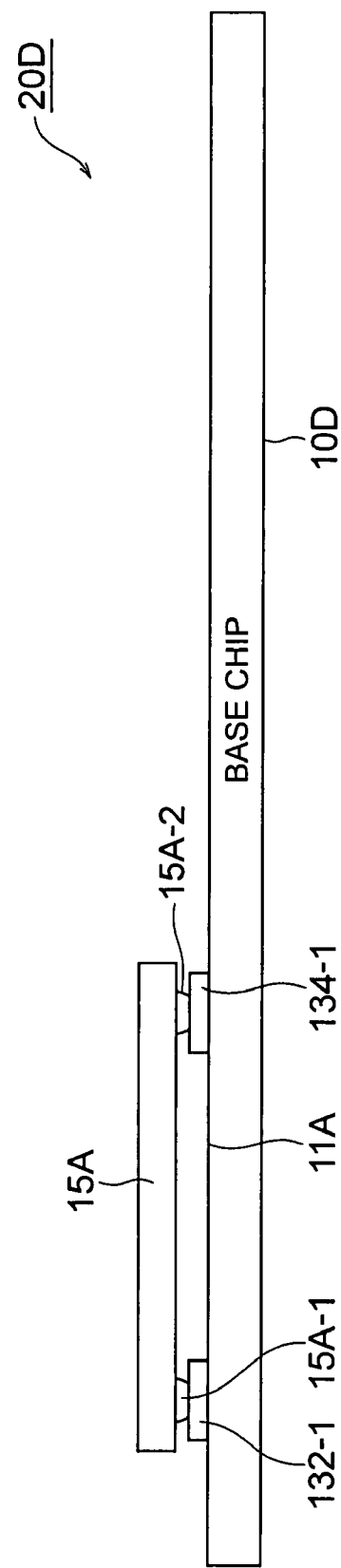
FIG. 18 is a schematic plan view showing the first semiconductor integrated circuit device (the first microcontroller) with the semiconductor package removed in order to describe a fifth electrical connection method according to a fifth exemplary embodiment of this invention.
Figure 19:
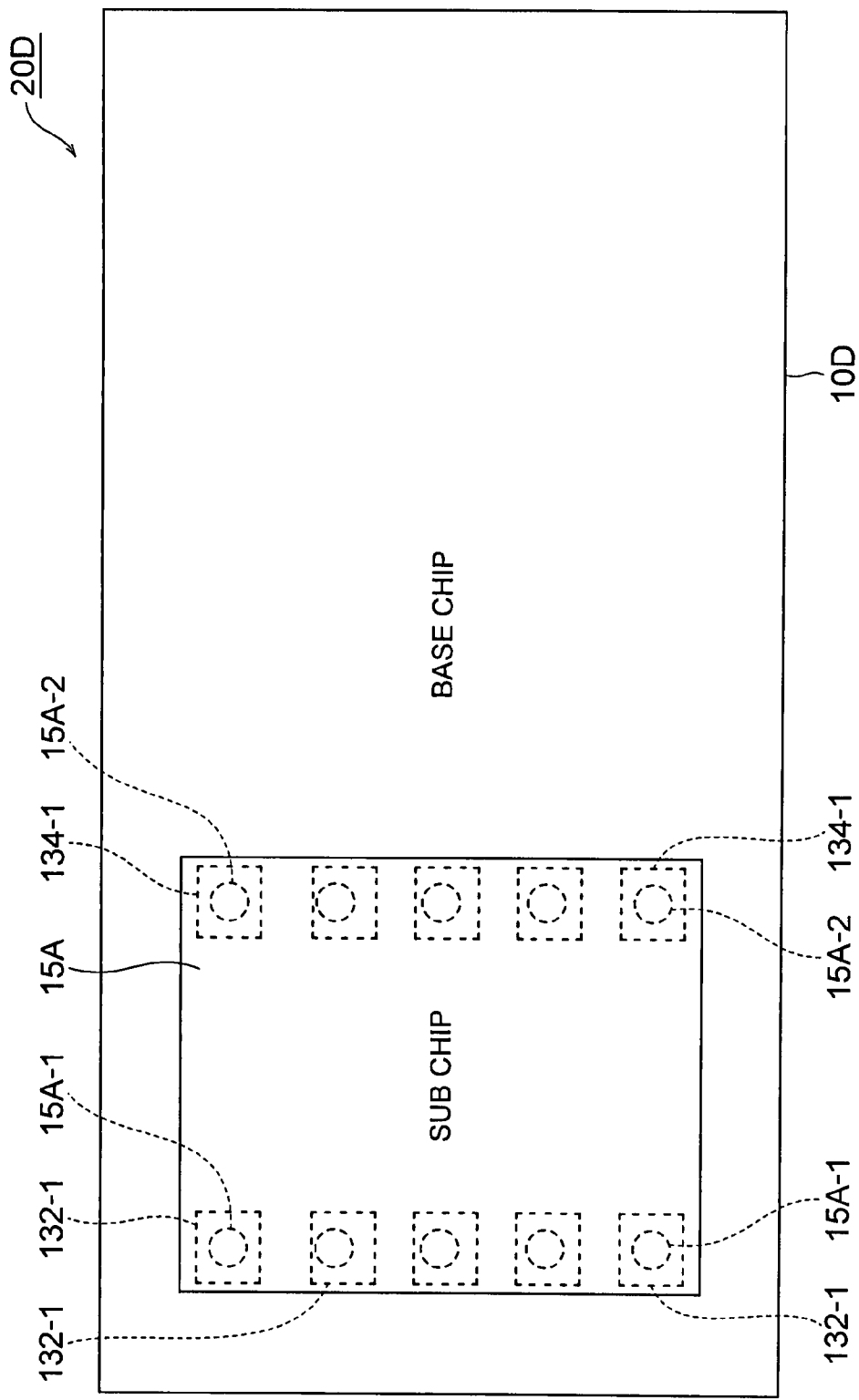
FIG. 19 is a schematic plan view of the first semiconductor integrated circuit device (the first microcontroller) illustrated in FIG. 18.

Referring to FIGS. 18 and 19, the description will proceed to a fifth electrical connection method for electrically connecting a programmable ROM (OTP) 15A with the first internal bus 13 by using the facedown bonding technique. FIGS. 18 and 19 are a schematic sectional view and a schematic plan view, respectively, which show a first semiconductor integrated circuit device (a first microcontroller) 20D with the semiconductor package 17 removed in order to describe the fifth electrical connection method according to the exemplary embodiment of this invention.

The first semiconductor integrated circuit device (the first microcontroller) 20D shown in FIGS. 18 and 19 is similar in structure to the first semiconductor integrated circuit device (the first microcontroller) 20 shown in FIG. 11 except that positions for forming the internal address bonding pads 132-1 led from the internal address bus 132 and the internal data bonding pads 134-1 led from the internal data bus 134 are different from those illustrated in FIG. 11 in the manner which will later be described and bumps are used in lieu of the wire bonding. The same reference symbols are attached to those having similar functions of those illustrated in FIG. 11.

The first semiconductor integrated circuit device 20D comprises a first semiconductor integrated circuit board 10D and the programmable ROM (OTP) 15A stacked on the first semiconductor integrated circuit board 10D in the manner which will later be described. The first semiconductor integrated circuit board 10D is also called the base chip while the programmable ROM (OTP) 15A is also called the sub chip.

The first semiconductor integrated circuit board 10D comprises an area 11A in which the mask ROM 11 (see FIG. 1) should be formed. Such an area 11A is called the mask ROM area. The programmable ROM (OTP) 15A is stacked on the first semiconductor integrated circuit board 10D in the manner which will later be described.

The first semiconductor integrated circuit board 10D further comprises the first internal bus 13 (e.g., see FIG. 12). The first internal bus 13 comprises the internal address bus 132 and the internal data bus 134.

As shown in FIGS. 18 and 19, on the mask ROM area 11A, the plurality of internal address bonding pads 132-1 and the plurality of internal data bonding pads 134-1 are formed. In the manner which is described above, the internal address bonding pads 132-1 and the internal data bonding pads 134-1 are also collectively called the bus connecting terminals.

On the other hand, the programmable ROM (OTP) 15A comprises a plurality of address bumps 15A-1 and a plurality of data bumps 15A-2. The address bumps 15A-1 and the data bumps 15A-2 are collectively called ROM connecting terminals. As shown in FIGS. 18 and 19, the plurality of address bumps 15A-1 are formed at positions corresponding to the plurality of internal address bonding pads 132-1 while the plurality of data bumps 15A-2 are formed at positions corresponding to the plurality of internal data bonding pads 134-1.

In other words, the plurality of internal address bonding pads (bus connecting terminals) 132-1 are disposed in mirror reversal placement of the placement of the plurality of address bumps (ROM connecting terminals) 15A-1 while the plurality of internal data bonding pads (bus connecting terminals) 134-1 are disposed in mirror reversal placement of the placement of the plurality of data bumps (ROM connecting terminals) 15A-2.

The plurality of address bumps 15A-1 of the programmable ROM (OTP) 15A are electrically connected to the corresponding internal address bonding pads 132-1, respectively, while the plurality of data bumps 15A-2 of the programmable ROM (OTP) 15A are electrically connected to the corresponding internal data bonding pads 134-1, respectively. Although those electrical connections may adopt various methods, it is preferably to connect via an ACF (anisotropic conductive film) or a NCF (non-conductive film). As a matter of course, solder bumps or conductive adhesive may be used.

In addition, the first semiconductor integrated circuit board (the first microcontroller board) 10D and the programmable ROM (OTP) 15A are sealed in the same semiconductor package 17 (see FIG. 8) with the programmable ROM (OTP) 15A stacked on the first semiconductor integrated circuit board (the first microcontroller board) 10D.

Although structure other than this is similar to that of the above-mentioned exemplary embodiments, illustration and description thereof will be omitted.

In the manner which is described above, the facedown bonding (wireless bonding) is carried out from the ROM connecting terminals 15A-1 and 15A-2 of the sub chip 15A to the bus wires (the first internal bus) 13 in the base chip 10D. With this structure, it is possible to decrease the number of terminals of the semiconductor package 17 and it is possible to prevent the input/output area of the base chip 10D from increasing. In addition, configuration of the package pins of the first semiconductor integrated circuit device 20D is compatible with configuration of package pins of the second semiconductor integrated circuit device 200 using only the base chip 100 as shown in FIG. 7. As a result, the first semiconductor integrated circuit device 20D and the second semiconductor integrated circuit device 200 are compatible for reliability with each other. Furthermore, inasmuch as the above-mentioned plurality of internal address bonding pads 132-1 and the above-mentioned plurality of internal data bonding pads 134-1 are deleted on using only the base chip 100, it is possible to prevent a chip area from increasing on using only the base chip 100.

Now, the description will proceed to problems on writing or program data in the programmable ROM (OTP) 15.

As shown in FIG. 3, when the programmable ROM (OTP) 15 is stacked on the first semiconductor integrated circuit board (the first microcontroller board) 10, it is necessary to apply a power supply terminal VPP of the programmable ROM (OTP) 15 with a high voltage (e.g. 12 volts) in order to write or program data in the programmable ROM (OTP) 15.

Figure 20:
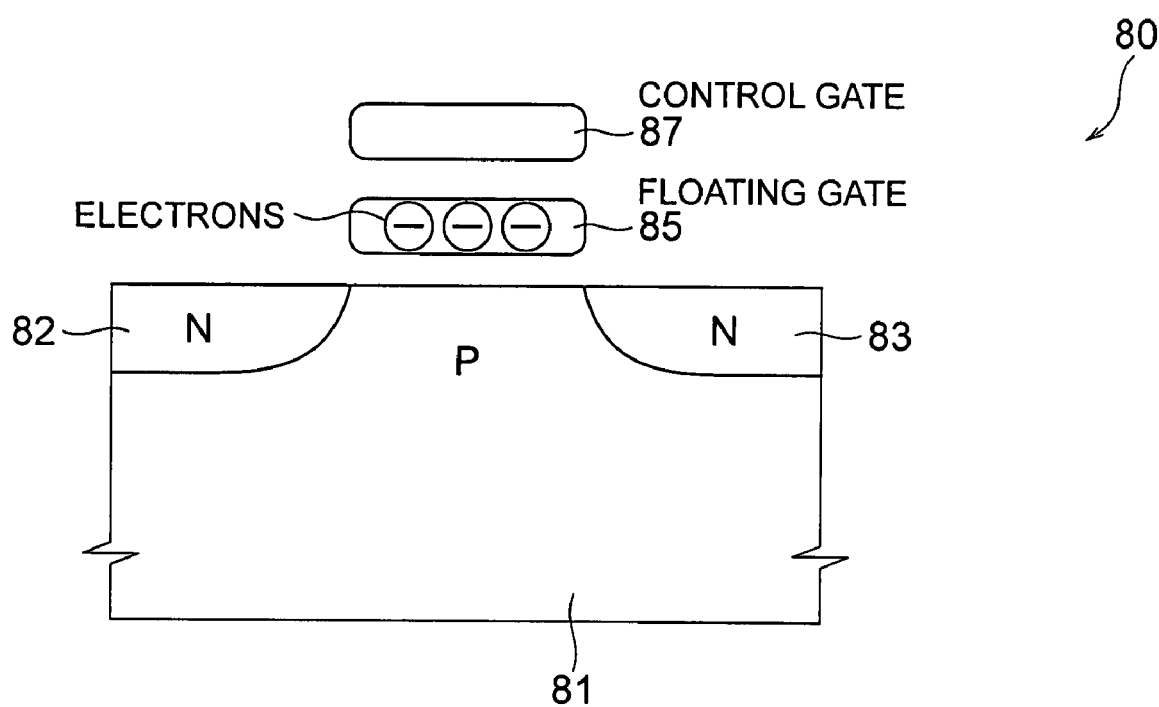
FIG. 20 is a cross sectional view showing structure of a memory cell constituting the programmable ROM.

Referring to FIG. 20, this reason will be described. FIG. 20 is a cross sectional view showing structure of a memory cell 80 constituting the programmable ROM 15. The illustrated memory cell 80 consists of an N-channel type MOS transistor.

More specifically, the memory cell 80 comprises a P-type substrate 81 in which two N regions 82 and 83 are diffused. One N region 82 serves as a source while another region 83 serves as a drain. On a surface of the P-type substrate 81, an area between the drain 83 and the source 82 is covered with an oxide layer (not shown). On the oxide layer, a floating gate 85 is adhered. On the floating gate 85, a control gate 87 is adhered via an interlayer oxide layer (not shown).

When data is electrically written in the memory cell 80 having such a structure, it is possible to allow to implant electrons in the floating gate 85 by applying the control gate 87 with the high voltage of 12 volts. It is therefore possible to modify a threshold value of the N-channel type MOS transistor. As a result, it is possible to write data of "1" or "0" in the memory cell 80. Inasmuch as the electrons on the floating gate 85 are insulated from surroundings, data is not erased even if the power is turned off. In the manner which is described above, it is possible to use the memory cell 80 as the programmable ROM 15.

In the manner which is described above, it is necessary to apply the high voltage (e.g. 12 volts) with the power supply terminal VPP of the programmable ROM (OTP) 15 in order to write data in the programmable ROM (OTP) 15.

On the other hand, in order to reduce the number of the package pins 55 in the first semiconductor integrated circuit device (the first microcontroller) 20 shown in FIG. 3, it is often carried out to make the power supply terminal VPP of the programmable ROM (OTP) 15 and another terminal of the first semiconductor circuit board (the first microcontroller board) 10 multiplex to the same package pin (the outer leading wire) 55 of the first semiconductor integrated circuit device (the first microcontroller) 20.

Figure 21:
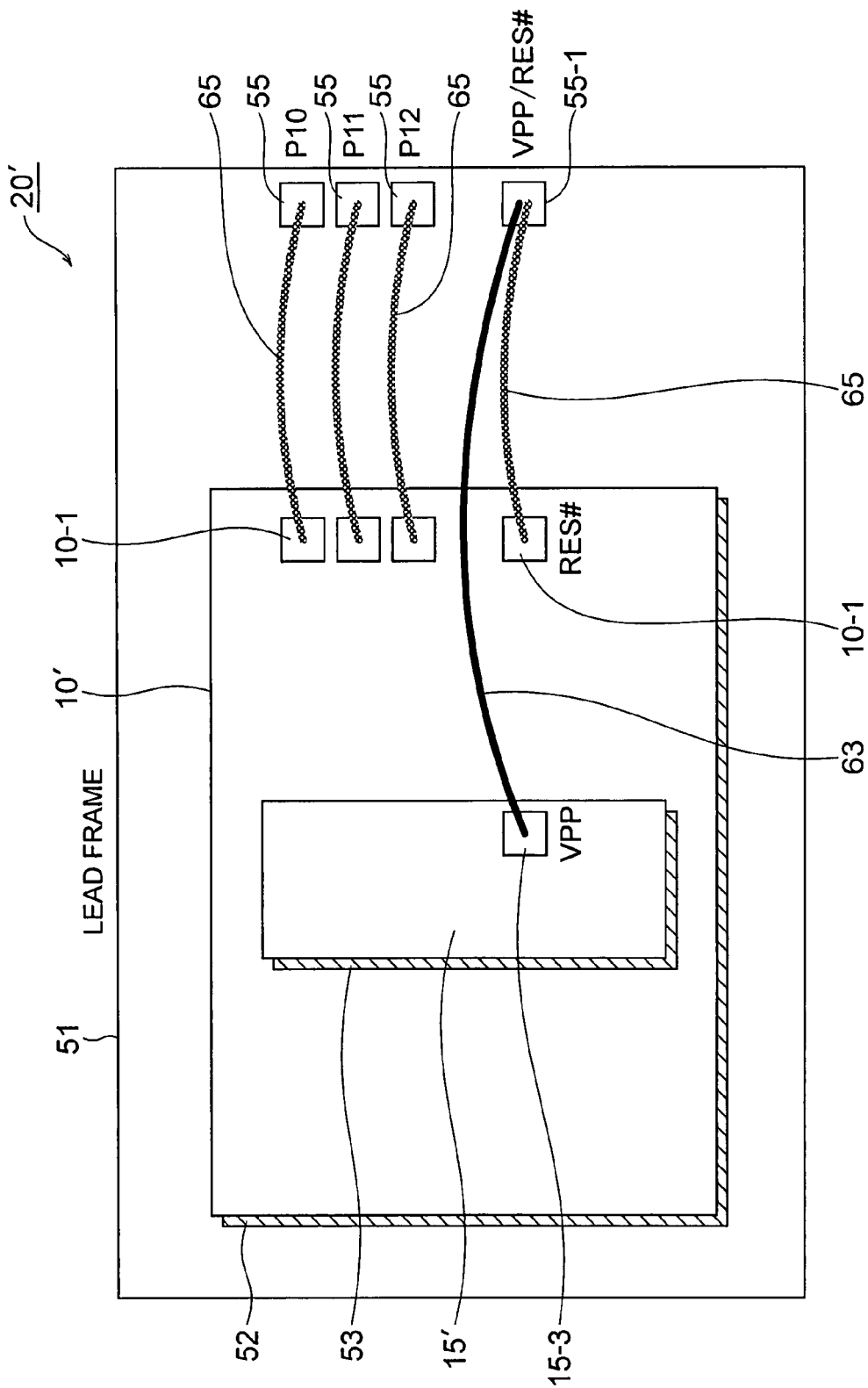
FIG. 21 is a schematic plan view showing a related semiconductor integrated circuit device (microcontroller) wherein a package pin is multiplexed.

FIG. 21 is a schematic plan view showing a related semiconductor integrated circuit device (microcontroller) 20' wherein the package pin (the outer leading wire) 55 is multiplexed in the manner which is described above.

A related semiconductor integrated circuit board (a related microcontroller board) 10' is adhesively fixed on the lead frame (the wiring board) 51 via the dice bonding agent 52. A related programmable ROM (OTP) 15' is adhesively fixed (stacked) on a mask ROM area (not shown) of the related semiconductor integrated circuit board (the related microcontroller board) 10' via the dice bonding agent 53. The related semiconductor integrated circuit board (the related microcontroller board) 10' and the related programmable ROM (OTP) 15' are sealed in the same semiconductor package 17 (see FIG. 8) with the related programmable ROM (OTP) 15' stacked on the related semiconductor circuit board (the related microcontroller board) 10'. The plurality of leads (outer leading wires) 55 are disposed or expanded from the semiconductor package 17.

The programmable ROM (OTP) 15' comprises the address bonding pads 15-1 (see FIG. 9), the data bonding pads 15-2 (see FIG. 9), and the power supply bonding pad (the power supply terminal) 15-3 (VPP). One of the plurality of leads 55 is a power supply bonding pad (power supply terminal) 55-1 (VPP). The power supply bonding pad (the power supply terminal) 55-1 (VPP) also serves as a reset terminal (RES#). Accordingly, the bonding pad (the outer reading lead) 55-1 is also called a power supply/reset bonding pad (power supply/reset terminal) VPP/RES#.

In addition, the related semiconductor integrated circuit board (the related microcontroller board) 10' has a reset terminal RES# as one of the plurality of base bonding pads 10-1. The reset terminal RES# is electrically connected to the power supply/reset terminal VPP/RES# through the bonding wire 65. In addition, the power supply terminal VPP of the related programmable ROM (OTP) 15' is electrically connected to the power supply/reset terminal VPP/RES#.

With this structure, the related semiconductor integrated circuit board (the related microcontroller board) 10' is applied with the high voltage of 12 volts. Accordingly, it is necessary to manufacture the related semiconductor integrated circuit board (the related microcontroller board) 10' at a high withstand voltage process which is enable to enter the high voltage. As a result, the cost of the related semiconductor integrated circuit board (the related microcontroller board) 10' increases caused by the problem of the high withstand voltage process which is applied thereto.

In an exemplary embodiment of this invention which will later be described, the problem where the cost of the related semiconductor integrated circuit board (the related microcontroller board) 10' increases is resolved.

Figure 22:
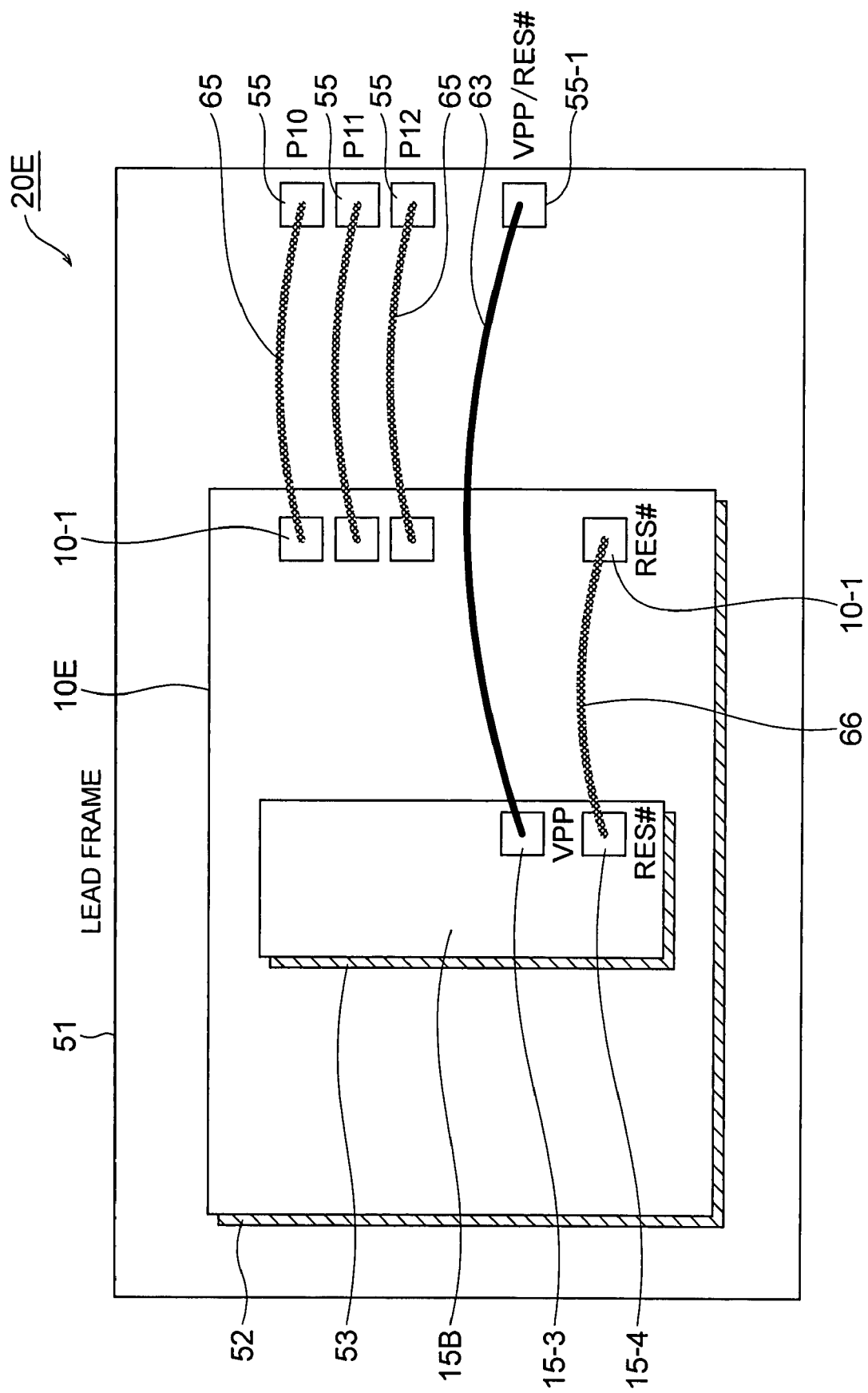
FIG. 22 is a schematic plan view showing a semiconductor integrated circuit device (microcontroller) according to an exemplary embodiment of this invention wherein a package pin is multiplexed.
Figure 23:
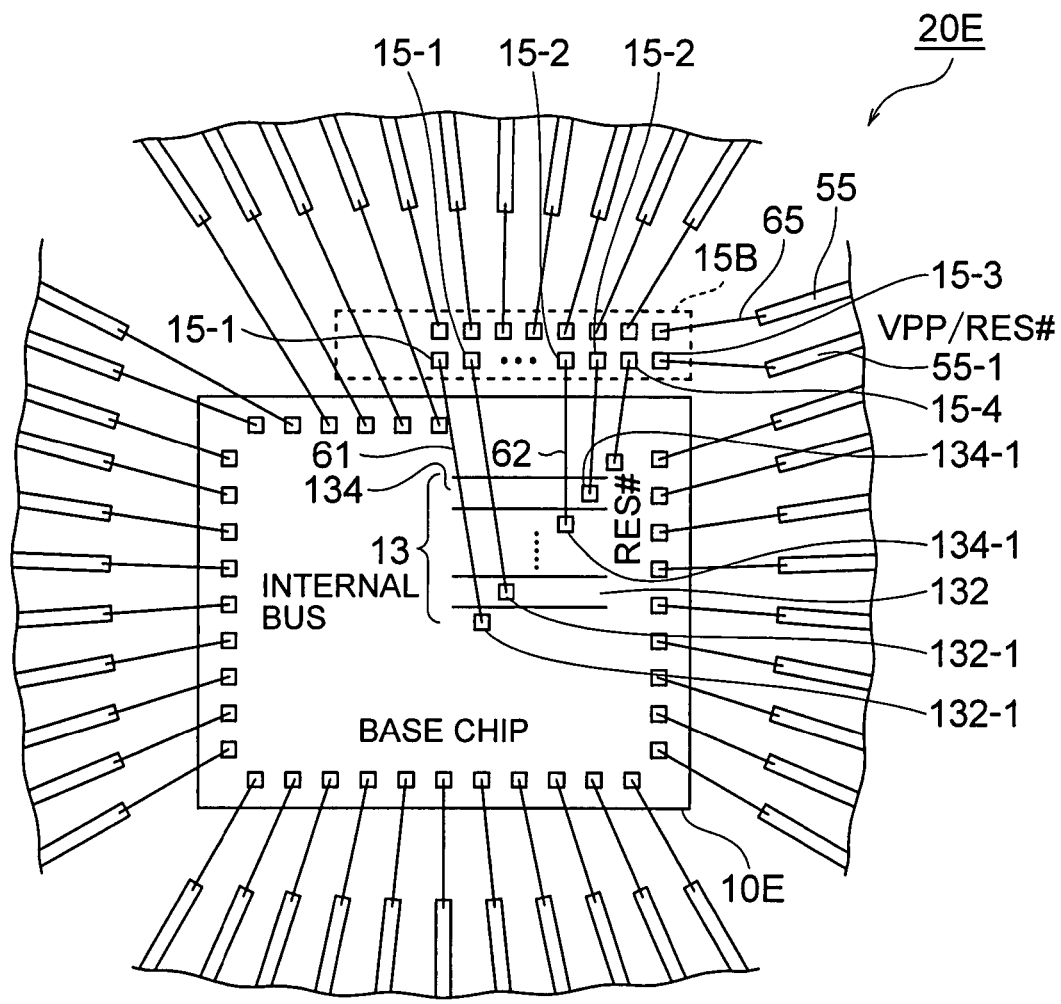
FIG. 23 is a bonding view of a plane arrangement of the semiconductor integrated circuit device (the microcontroller) illustrated in FIG. 22.
Figure 24:
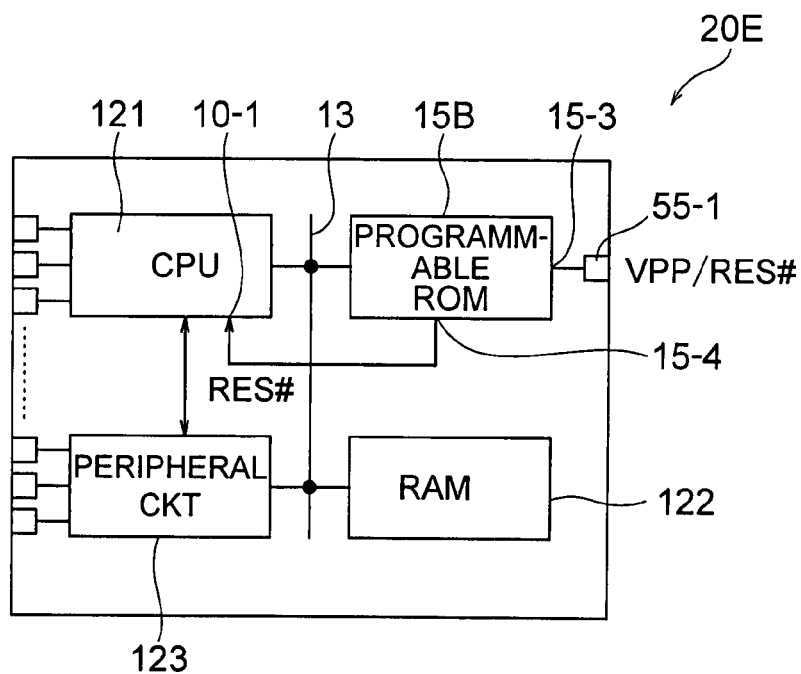
FIG. 24 is a block diagram of the semiconductor integrated circuit device (the microcontroller) illustrated in FIG. 22.

Referring to FIGS. 22, 23, and 24, the description will proceed to a semiconductor integrated circuit device (microcontroller) 20E according to an exemplary embodiment of this invention where the package pins (outer leading wires, outer leading leads) 55 are multiplexed. FIG. 22 is a schematic plan view of the semiconductor integrated circuit device (the microcontroller) 20E. FIG. 23 is a bonding view of a plane configuration of the semiconductor integrated circuit device (the microcontroller) 20E. FIG. 24 is a block diagram of the semiconductor integrated circuit device (the microcontroller) 20E. The semiconductor integrated circuit device (the microcontroller) 20E is also called a multi chip module.

Referring now to FIG. 22, the semiconductor integrated circuit device (the microcontroller) 20E comprises a semiconductor integrated circuit board (a microcontroller board) 10E and a programmable ROM (OTP) 15B. The semiconductor integrated circuit board (the microcontroller board) 10E is adhesively fixed on the lead frame (the die pad) 51 via the dice bonding agent 52. The programmable ROM (OTP) 15B is adhesively fixed (stacked) on a mask ROM area (not shown) of the semiconductor integrated circuit board (the microcontroller board) 10E via the dice bonding agent 53. The semiconductor integrated circuit board (the microcontroller board) 10E and the programmable ROM (OTP) 15B are sealed on the same semiconductor package 17 (see FIG. 8) with the programmable ROM (OTP) 15B stacked on the semiconductor integrated circuit board (the microcontroller board) 10E. The plurality of leads (package pins, outer leading wires, outer leading leads) are disposed or extended from the semiconductor package 17.

Although this exemplary embodiment describes an example where the OTP 15B is used as a nonvolatile memory device, other programmable ROM such as an EPROM, a flash memory, or the like may be used as the nonvolatile memory device.

Referring to FIG. 23 in addition to FIG. 22, the programmable ROM (OTP) 15B has the address bonding pads 15-1, the data bonding pads 15-2, the power supply bonding pad (the power supply terminal) 15-3 (VPP), and a reset output terminal 15-4 (RES#). In addition, the power supply bonding pad (the power supply terminal) 15-3 (VPP) is also called a first terminal while the reset output terminal 15-4 (RES#) is also called a second terminal.

One of the plurality of leads 55 is the power supply/reset bonding pad 55-1 (the power supply/reset terminal VPP/RES#). The power supply bonding pad 15-3 is electrically connected to the power supply/reset bonding pad 55-1 (the power supply/reset terminal VPP/RES#) via the bonding wire 63. The power supply/reset bonding pad 55-1 is selectively applied from the outside with the high voltage of 12 volts and a low voltage of a reset signal. In the example being illustrated, the high voltage of 12 volts is also called a first voltage while the low voltage of the reset signal is also called a second voltage.

The semiconductor integrated circuit board (the microcontroller board) 10B has a reset input terminal RES# as one of the plurality of the base bonding pads 10-1. The reset input terminal 10-1 (RES#) is electrically connected to the reset output terminal 15-4 (RES#) via a bonding wire 66. In addition, the reset input terminal 10-1 (RES#) is also called a third terminal.

In addition, as shown in FIG. 23, the semiconductor integrated circuit board 10E further comprises the internal bus 13. The internal bus 13 comprises the internal address bus 132 and the internal data bus 134. The internal address bonding pads 132-1 are led from the internal address bus 132 while the internal data bonding pads 134-1 are led from the internal data bus 134. On the other hand, in the manner which is described above, the programmable ROM (OTP) 15B comprises the address bonding pads 15-1 and the data bonding pads 15-2: The address bonding pads 15-1 and the data bonding pads 15-2 are collectively called the ROM connecting terminals.

The address bonding pads 15-1 of the programmable ROM (OTP) 15B are electrically connected to the internal address bonding pads 132-1 via the bonding wires 61 while the data bonding pads 15-2 of the programmable ROM (OTP) 15B are electrically connected to the internal data bonding pads 134-1 via the bonding wires 62.

As shown in FIG. 24, the multi chip module 20E comprises, as the other integrated circuits 12, a CPU 121, an RAM 122, and a peripheral circuit (an input/output control LSI) 123.

Although the semiconductor integrated circuit device (the microcontroller) 20E shown in FIGS. 22 through 24 illustrates an example where the package pin (the outer connecting terminal) 55-1 is the power supply/reset bonding pad (the power supply/reset terminal VPP/RES#) into which the power supply terminal VPP and the reset terminal RES# are multiplexed (shared), it is not limited to this as a matter of course. That is, the package pin (the outer leading wire, the outer leading lead) 55-1 may be a bonding pad where the power supply terminal VPP applied with the high voltage and a terminal applied with another low voltage are multiplexed (shared).

Figure 25:
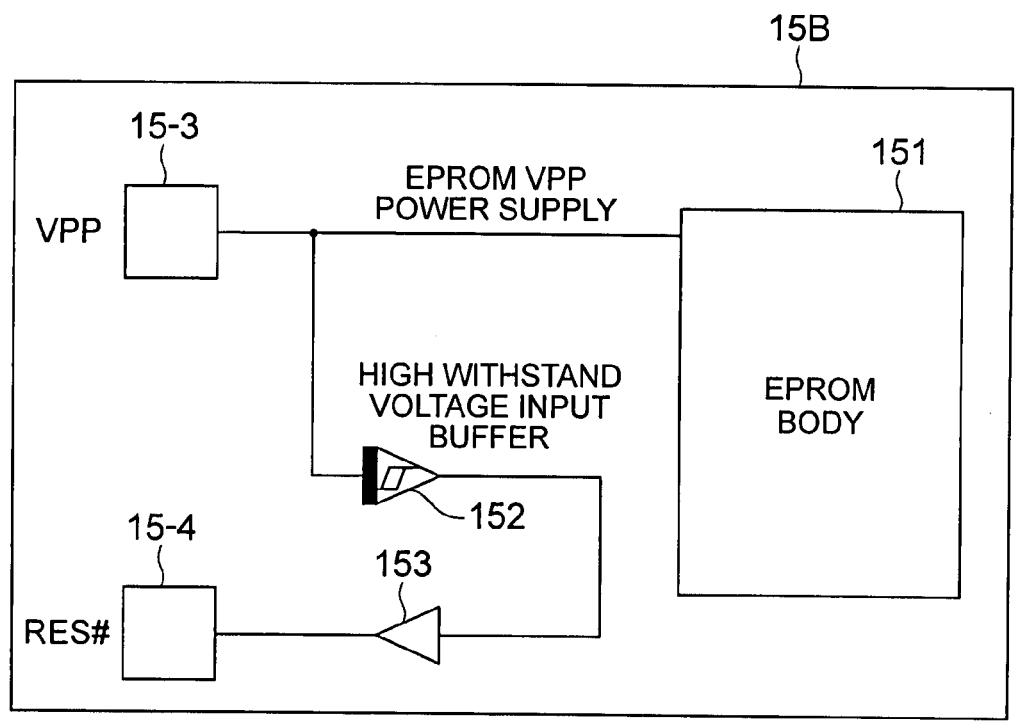
FIG. 25 is a block diagram of a programmable ROM for use in the semiconductor integrated circuit device (the microcontroller) illustrated in FIG. 22.

As shown in FIG. 25, the programmable ROM (OTP) 15B comprises an EPROM body 151 connected to the power supply bonding pad (the power supply terminal) 15-3 (VPP), a high withstand voltage input buffer 152 connected to the power supply bonding pad 15-3 (the power supply terminal VPP), a current amplifying buffer 153 connected between the high withstand voltage input buffer 152 and the reset output terminal 15-4 (RES#). In the manner which will later be described, the high withstand voltage input buffer 152 serves as a voltage converting circuit for converting the first voltage into the second voltage lower than the first voltage.

In other words, a power supply wire (an EPROM VPP power supply) extends from the first terminal 15-3 (VPP) to the EPROM body 151 within the programmable ROM (OTP) 15B. From this power supply wire, a specific wire branches off. The specific wire is connected to the second terminal 15-4 (RES#) through the high withstand voltage input buffer 152 acting as the voltage converting circuit.

Figure 26B:
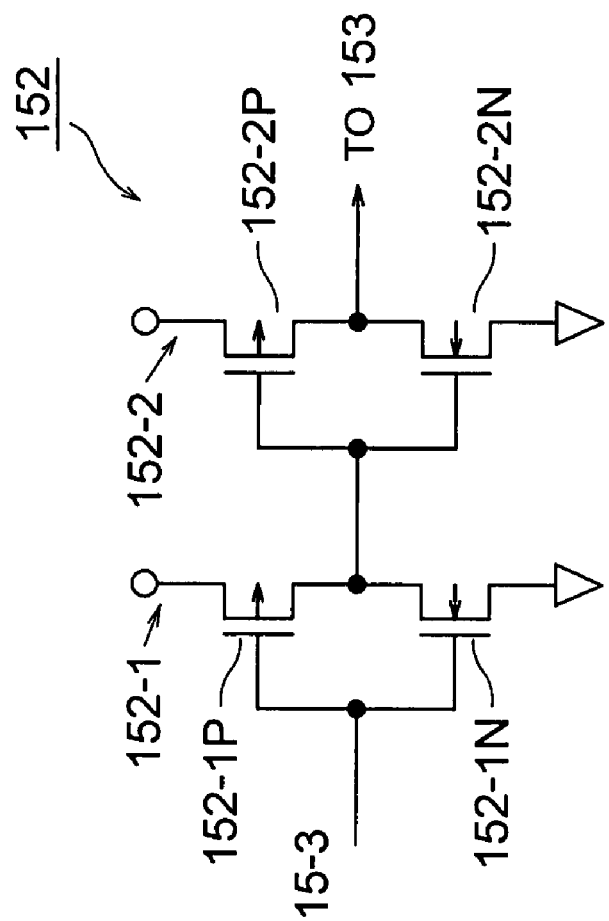
FIG. 26B is a circuit diagram of an equivalent circuit of the high withstand voltage input buffer illustrated in FIG. 26A.
Figure 26A:
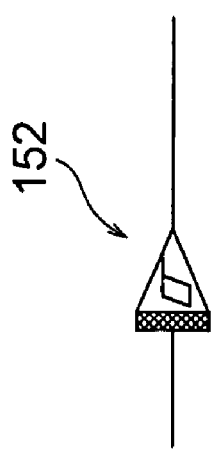
FIG. 26A is a block diagram of a high withstand voltage input buffer for use in the programmable ROM illustrated in FIG. 25.

FIG. 26A shows a block diagram of the high withstand voltage input buffer 152 while FIG. 26B is a circuit diagram showing an equivalent circuit of the high withstand voltage input buffer 152. As shown in FIG. 26B, the high withstand voltage input buffer 152 comprises a circuit where a first complementary metal oxide semiconductor (CMOS) inverter 152-1 and a second CMOS inverter 152-2 are cascade connected.

The first CMOS inverter 152-1 comprises a first n-channel field effect transistor (FET) 152-1N and a first p-channel FET 152-1P. The first n-channel FET 152-1N and the first p-channel FET 152-1P have gates which are connected to each other and which are connected to the power supply bonding pad (the power supply terminal) 15-3 (VPP). The first n-channel FET 152-1N and the first p-channel FET 152-1P have drains which are connected to each other.

On the other hand, the second CMOS inverter 152-2 comprises a second n-channel FET 152-2N and a second p-channel FET 152-2P. The second n-channel FET 152-2N and the second p-channel FET 152-2P have gates which are connected to each other and which are connected to the drains of the first n-channel FET 152-1N and the first p-channel FET 152-1P. The second n-channel FET 152-2N and the second p-channel FET 152-2P have drains which are connected to each other and which are connected to an input terminal of the current amplifying buffer 153.

Figure 27A:
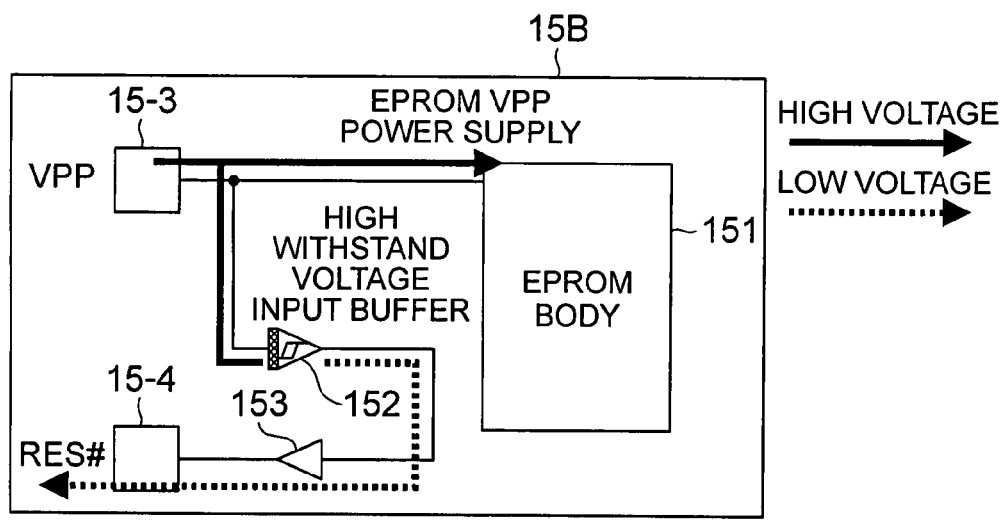
FIG. 27A is a block diagram of the programmable ROM (OTP) for use in describing operation when a high voltage of 12 volts is applied to a power supply/reset bonding pad (a power supply/reset terminal) in order to write data in the programmable ROM (OTP)
Figure 27B:
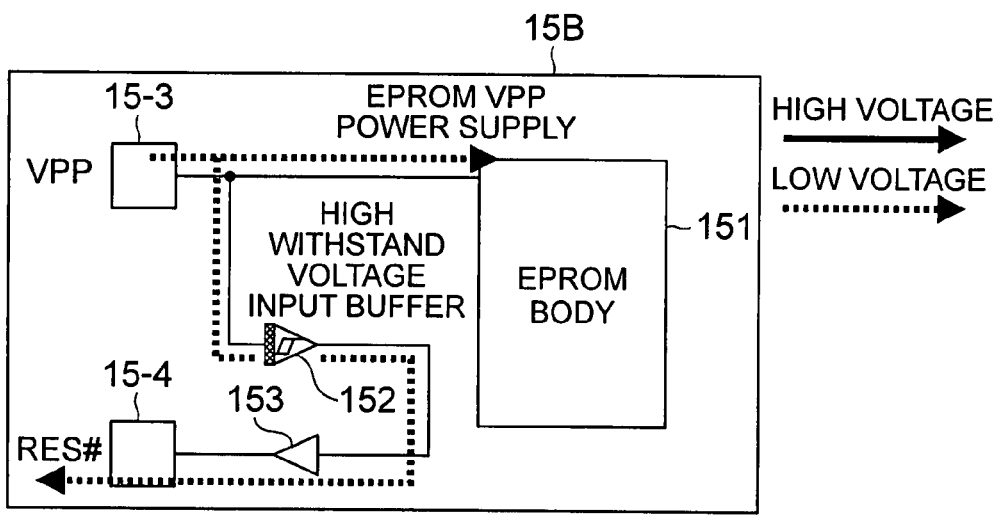
FIG. 27B is a block diagram of the programmable ROM (OTP) for use in describing operation when a reset signal having a normal voltage (a low voltage) is inputted to the power supply/reset bonding pad (the power supply/reset terminal) in order to reset a CPU.

Referring now to FIGS. 27A and 27B in addition to FIG. 22, description will be made as regards operation of the programmable ROM (OTP) 15B illustrated in FIG. 25. FIG. 27A is a block diagram of the programmable ROM (OTP) 15B for use in describing operation when the high voltage of 12 volts is applied to the power supply/reset bonding pad 55-1 (the power supply/reset terminal VPP/RES#) in order to write or program data in the programmable ROM (OTP) 15B. FIG. 27B is a block diagram of the programmable ROM (OTP) 15B for use in describing operation when the reset signal having a normal voltage (the low voltage) is inputted to the power supply/reset bonding pad 55-1 (the power supply/reset terminal VPP/RES#) in order to reset the CPU 21 (see FIG. 24). The high voltage of 12 volts is also called the first voltage while the low voltage of the reset signal is also called the second voltage.

Referring now to FIGS. 22 and 27A, description will be made as regards operation when the high voltage (the first voltage) of 12 volts is applied to the power supply/reset bonding pad 55-1 (the power supply/reset terminal VPP/RES#) in order to write or program data in the programmable ROM (OTP) 15B. In this event, applied to the power supply/reset bonding pad 55-1 (the power supply/reset terminal VPP/RES#), the high voltage (the first voltage) of 12 volts is supplied to the power supply bonding pad 15-3 (the power supply terminal VPP) of the programmable ROM (OTP) 15B through the bonding wire 63. Inasmuch as the high voltage of 12 volts is applied to the EPROM body 151 for this reason, it is possible to write or program data in the programmable ROM (OTP) 15B.

In addition, the high voltage (the first voltage) of 12 volts is applied to the high withstand voltage input buffer 152. The high withstand voltage input buffer 152 converts the high voltage (the first voltage) of 12 volts into the low voltage (the second voltage). That is, the high withstand voltage input buffer 152 acts as the voltage converting circuit for converting the first voltage into the second voltage. The converted low voltage (the second voltage) is supplied to the reset output terminal 15-4 (RES#) through the current amplifying buffer 153. Therefore, inasmuch as it is unnecessary to manufacture the semiconductor integrated circuit board (the microcontroller board) 10E at the high withstand voltage process which is enable to enter the high voltage (the first voltage), it is possible to reduce cost of the semiconductor integrated circuit board (the microcontroller board) 10E.

Referring to FIGS. 22 and 27B, description will be made as regards operation when the reset signal having the low voltage (the second voltage) is applied to the power supply/reset bonding pad 55-1 (the power supply/reset terminal VPP/RES#) in order to reset the CPU 21 (see FIG. 24). In this event, applied to the power supply/reset bonding pad 55-1 (the power supply/reset terminal VPP/RES#), the reset signal having the low voltage (the second voltage) is supplied to the power supply bonding pad 15-3 (the power supply terminal VPP) of the programmable ROM (OTP) 15B through the bonding wire 63.

In addition, the reset signal having the low voltage (the second voltage) is also applied to the high withstand voltage input buffer 152. The high withstand voltage input buffer 152 produces the reset signal having the low voltage (the second voltage) as the reset signal having the low voltage (the second voltage) as it is. Produced by the high withstand voltage input buffer 152, the reset signal having the low voltage (the second voltage) is supplied to the reset output terminal 15-4 (RES#) through the current amplifying buffer 153. Therefore, the CPU 121 (see FIG. 24) is reset.

While this invention has thus far been described in conjunction with a several exemplary embodiments thereof, it will now be readily possible for those skilled in the art to put this invention into various other manners without departing from the scope of this invention. For example, although description is exemplified in a case where the programmable ROM (the nonvolatile memory device) is stacked on the first semiconductor integrated circuit board, the programmable ROM (the nonvolatile memory device) and the first semiconductor integrated circuit board may be mounted on the lead frame (the wiring board) in one plane.

What is claimed is:

1. A semiconductor integrated circuit device comprising:
a wiring board having a plurality of outer leading wires;
a semiconductor integrated circuit board mounted on said wiring board, said semiconductor integrated circuit board comprising a mask read only memory (ROM) area and an internal bus, and said semiconductor integrated circuit board having a plurality of board connecting terminals which are electrically connected to said plurality of outer leading wires;
a programmable ROM mounted on said semiconductor integrated circuit board, said programmable ROM having a plurality of ROM connecting terminals; and
a plurality of bus connecting terminals connected to said internal bus, said plurality of bus connecting terminals being electrically connected to said plurality of ROM connecting terminals, respectively.

2. The semiconductor integrated circuit device as claimed in claim 1, wherein said plurality of ROM connecting terminals are electrically connected to said plurality of bus connecting terminals using a wire bonding technique.

3. The semiconductor integrated circuit device as claimed in claim 1, wherein said plurality of bus connecting terminals are disposed around a periphery of said semiconductor integrated circuit board.

4. The semiconductor integrated circuit device as claimed in claim 1, wherein said plurality of bus connecting terminals are formed on said mask ROM area.

5. The semiconductor integrated circuit device as claimed in claim 1, wherein said plurality of bus connecting terminals are disposed on said internal bus.

6. The semiconductor integrated circuit device as claimed in claim 1, wherein said plurality of bus connecting terminals are disposed on said semiconductor integrated circuit board in mirror reversal placement with respect to placement of said plurality of ROM connecting terminals.

7. The semiconductor integrated circuit device as claimed in claim 6, wherein said plurality of ROM connecting terminals are electrically connected to said plurality of bus connecting terminals using a facedown bonding technique.

* * * * *